(12) United States Patent
Kasugai

(10) Patent No.: US 11,463,615 B2
(45) Date of Patent: Oct. 4, 2022

(54) IMAGING APPARATUS

(71) Applicant: Panasonic Intellectual Property Management Co., Ltd., Osaka (JP)

(72) Inventor: Hiroki Kasugai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/814,666

(22) Filed: Mar. 10, 2020

(65) Prior Publication Data

US 2020/0296279 A1    Sep. 17, 2020

(30) Foreign Application Priority Data

Mar. 13, 2019  (JP) .............................. JP2019-046330
Dec. 10, 2019  (JP) .............................. JP2019-222866

(51) Int. Cl.
*H04N 5/232*  (2006.01)
*H03G 3/24*   (2006.01)
*H04R 3/00*   (2006.01)

(52) U.S. Cl.
CPC ........... *H04N 5/23218* (2018.08); *H03G 3/24* (2013.01); *H04N 5/23212* (2013.01);
(Continued)

(58) Field of Classification Search
CPC ........... H04N 5/23218; H04N 5/23212; H04N 5/23245; H04N 5/772; H04N 5/232939;
(Continued)

(56) References Cited

U.S. PATENT DOCUMENTS 5,999,214 A * 12/1999 Inagaki .................... H04N 7/15
                                                       348/14.07
9,332,211 B2 * 5/2016 Lee ......................... H04N 5/772
(Continued)

FOREIGN PATENT DOCUMENTS

EP    2680615 A1   1/2014
EP    3829161 A1   6/2021
(Continued)

OTHER PUBLICATIONS

Japanese office Action corresponding application No. 2019-222866 dated Jan. 26, 2021.
(Continued)

*Primary Examiner* — Shahbaz Nazrul
(74) *Attorney, Agent, or Firm* — Renner, Otto, Boisselle & Sklar, LLP

(57) ABSTRACT

An imaging apparatus includes: an imager configured to capture a subject image to generate image data; an audio input device configured to receive audio data indicating sound during; a detector configured to detect a subject and a its type based on the image data generated by the imager; an audio processor configured to process the audio data received by the audio input device based on the type of subject detected by the detector; and an operation member configured to set a target type to be processed by the audio processor among a plurality of types including first and second types different from each other, based on a user operation, wherein the audio processor is configured to process the audio data to emphasize or suppress specific sound corresponding to the target type in audio data received when a subject of the target type is detected in the image data.

6 Claims, 14 Drawing Sheets

(52) U.S. Cl.
CPC ......... *H04N 5/23245* (2013.01); *H04R 3/005* (2013.01); *H04R 2430/23* (2013.01)

(58) Field of Classification Search
CPC .... H04N 5/232945; H03G 3/24; H04R 3/005; H04R 2430/23; H04R 2430/03; H04R 2430/01; G10L 25/57; G10L 25/54; G06K 2209/27; G06K 9/00671; G06K 9/00362; G06V 2201/10; G06V 20/20; G06V 40/10

See application file for complete search history.

(56) References Cited

U.S. PATENT DOCUMENTS

| | | | | |
|---|---|---|---|---|
| 10,051,364 | B2* | 8/2018 | Kim | G06F 3/165 |
| 10,778,900 | B2* | 9/2020 | Kelly | G06K 9/00315 |
| 10,909,384 | B2* | 2/2021 | Matsumoto | H04R 3/005 |
| 2003/0160862 | A1 | 8/2003 | Charlier et al. | |
| 2005/0140810 | A1* | 6/2005 | Ozawa | H04N 5/232933 348/333.02 |
| 2009/0066798 | A1 | 3/2009 | Oku et al. | |
| 2011/0102619 | A1 | 5/2011 | Niinami | |
| 2014/0085538 | A1* | 3/2014 | Kaine | H04N 5/607 348/462 |
| 2014/0369506 | A1 | 12/2014 | Arrasvuor et al. | |
| 2015/0162019 | A1* | 6/2015 | An | G10L 21/0208 704/226 |
| 2017/0289681 | A1* | 10/2017 | Yuan | H04N 5/23293 |

FOREIGN PATENT DOCUMENTS

| | | |
|---|---|---|
| JP | 2005-124090 A | 5/2005 |
| JP | 2009-049873 A | 3/2009 |
| JP | 2009-065587 A | 3/2009 |
| JP | 2010-154260 A | 7/2010 |
| JP | 2010245695 A | 10/2010 |
| JP | 2011-071684 A | 4/2011 |
| JP | 2011-160044 A | 8/2011 |
| JP | 2011254400 A | 12/2011 |
| WO | 2013146893 A1 | 10/2013 |

OTHER PUBLICATIONS

Extended European Search Report corresponding application No. 20162359.2, dated Jul. 3, 2020.
Second Office Action for corresponding Japanese Application No. 2019-222866 dated Sep. 7, 2021 and its Machine Translation.
Communication pursuant to Article 94(3) EPC for corresponding European Application No. 20162359.2 dated Aug. 13, 2021.
Decision of Refusal for corresponding Japanese Application No. 2019-222866 dated Mar. 1, 2022 and its Machine Translation (citing JP reference corresponding to U.S. Pat. No. 2011102619A, previously cited).
Reconsideration Report for corresponding Japanese Application No. 2019-222866 dated Aug. 3, 2022 and it's translation.

* cited by examiner (SOUND OF "PEOPLE")

(SOUND OF "CAT")

A13

→ TIME

TRANSFORM

B13

IMAGING APPARATUS

BACKGROUND

1. Technical Field

The present disclosure relates to an imaging apparatus that performs imaging while acquiring sound.

2. Related Art

There is studied a technique for clearly collecting a sound of a specific subject at the time of shooting a moving image using an imaging apparatus (e.g., JP 2010-154260 A).

JP 2010-154260 A discloses a voice recognition apparatus including an imager and a microphone array. The voice recognition apparatus detects feature information on a subject image from image data generated by the imager, and detects feature information on voice from audio data generated by the microphone array. The voice recognition apparatus is configured to adjust directivity characteristics of the microphone array in accordance with a distance from a subject calculated from the image data and a distance from a sound source calculated from the audio data, in order to acquire a favorable voice for even a sound source that intermittently generates sound.

SUMMARY

However, a user during shooting is caused to change a direction and the like of the imaging apparatus while following a moving subject with his eyes, so that it is difficult to accurately cause directivity of the microphone to follow based on a detection result of voice. The prior art has a problem that it is difficult to clearly obtain voice of a specific subject in the imaging apparatus.

The present disclosure provides an imaging apparatus capable of easily obtaining sound of a subject according to a user's intention.

An imaging apparatus according to an aspect of the present disclosure includes an imager, an audio input device, a detector, an audio processor, and an operation member. The imager is configured to capture a subject image to generate image data. The audio input device is configured to receive audio data indicating sound during shooting using the imager. The detector is configured to detect a subject and a type of the subject based on the image data generated by the imager. The audio processor is configured to process the audio data received by the audio input device based on the type of subject detected by the detector. The operation member is configured to set a target type among a plurality of types based on a user operation on the imaging apparatus. The target type indicates a type to be processed by the audio processor. The plurality of types includes a first type and a second type different from the first type. The audio processor is configured to process the audio data to emphasize or suppress specific sound corresponding to the target type in audio data received when a subject of the target type is detected in the image data.

An imaging apparatus according to another aspect of the present disclosure includes an imager, an audio input device, a detector, a display, an operation member, an audio processor, and a processor. The imager is configured to capture a subject image to generate image data. The audio input device is configured to receive audio data indicating voice during shooting using the imager. The detector is configured to detect a subject and a type of the subject based on the image data generated by the imager. The display is configured to displays an image indicated by the image data. The operation member is configured to select a focus subject in the image from subjects detected by the detector based on a user operation on the imaging apparatus. The audio processor is configured to process the audio data received by the audio input device based on a type of selected subject by the operation member. The processor is configured to cause the display to display target type information indicating the type of the focus subject as a target type to be processed by the audio processor.

The imaging apparatus according to the present disclosure enables a sound of a subject to be easily obtained according to a user's intention.

DETAILED DESCRIPTION

Hereinafter, embodiments will be described in detail with reference to the drawings as appropriate. However, detailed description may be omitted more than necessary. For example, detailed descriptions of already well-known matters and duplicated descriptions for substantially identical configurations may be omitted. This is to avoid unnecessary redundancy of the following description and to facilitate understanding by those skilled in the art. The inventor(s) provides the accompanying drawings and the following description for those skilled in the art to fully understand the present disclosure, and does not intend them to limit the subject matter described in the scope of claims.

First Embodiment

In a first embodiment, it will be described that a digital camera, an example of an imaging apparatus according to the present disclosure, clearly obtains sound from a subject with a specific type such as a person or an animal by linking image recognition technique and sound extraction technique.

1-1. Configuration

Figure 1:
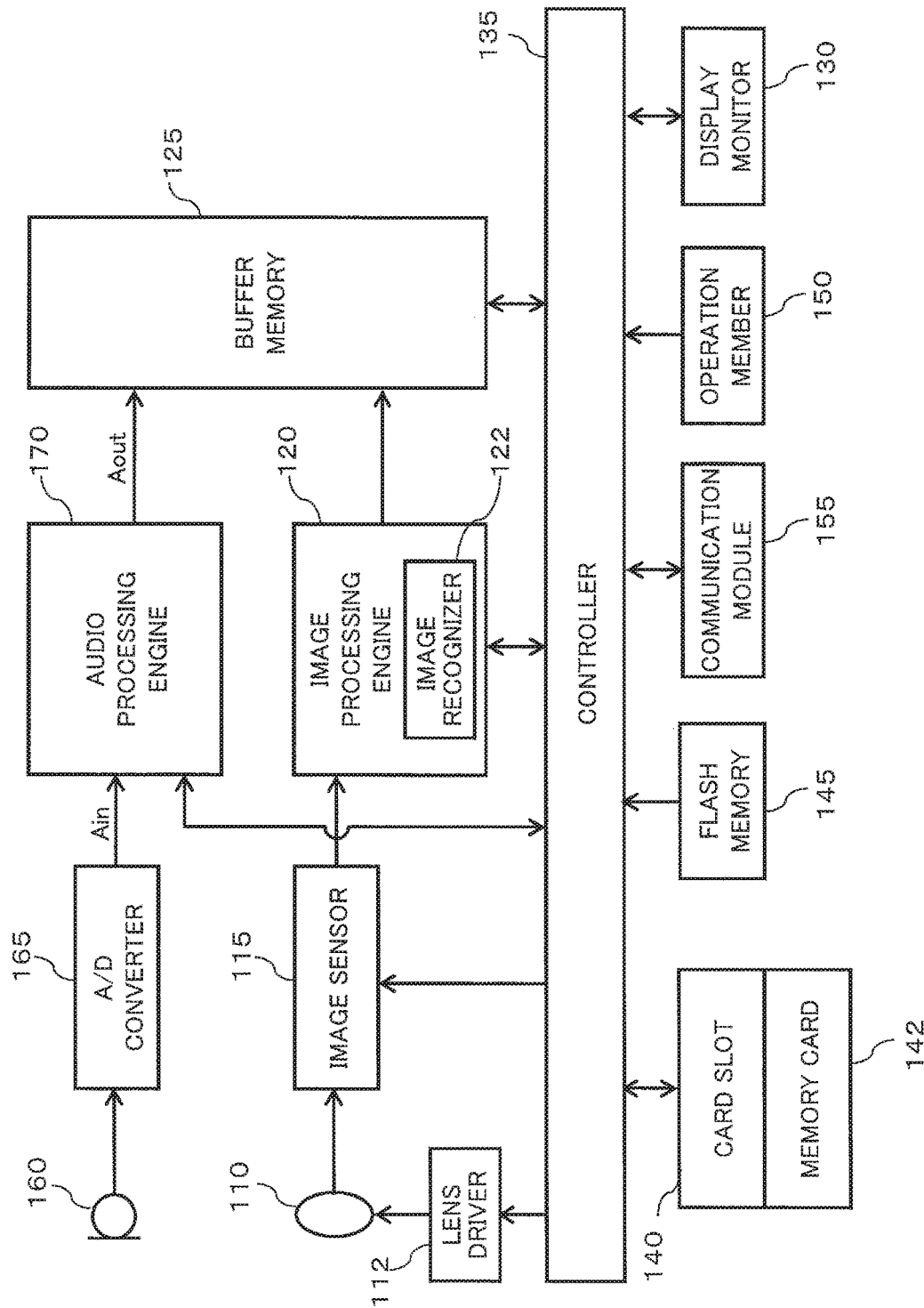
FIG. 1 is a diagram illustrating a configuration of a digital camera according to a first embodiment of the present disclosure.

With reference to FIG. 1, a configuration of the digital camera according to the first embodiment will be described.

FIG. 1 is a diagram illustrating a configuration of a digital camera 100 according to the present embodiment. The digital camera 100 of the present embodiment includes an image sensor 115, an image processing engine 120, a display monitor 130, and a controller 135. The digital camera 100 further includes a buffer memory 125, a card slot 140, a flash memory 145, an operation member 150, and a communication module 155. The digital camera 100 also includes a microphone 160, a microphone analog/digital (A/D) converter 165, and an audio processing engine 170. The digital camera 100 includes an optical system 110 and a lens driver 112, for example.

The optical system 110 includes a focus lens, a zoom lens, an optical image stabilization lens (OIS), a diaphragm, a shutter, and the like. The focus lens is configured to change a focus state of a subject image formed on the image sensor 115. The zoom lens is configured to change magnification of a subject image formed by the optical system. The focus lens and the like are each composed of one or a plurality of lenses.

The lens driver 112 drives the focus lens and the like in the optical system 110. The lens driver 112 includes a motor, to move the focus lens along an optical axis of the optical system 110 based on control of the controller 135. A means for driving the focus lens in the lens driver 112 can be fabricated by a DC motor, a stepping motor, a servo motor, an ultrasonic motor, or the like.

The image sensor 115 captures a subject image formed using the optical system 110, to generate imaging data. The imaging data constitutes image data indicating an image captured by the image sensor 115. The image sensor 115 generates image data for a new frame at a predetermined frame rate (e.g., 30 frames/second). Generation timing of image data and electronic shutter operation in the image sensor 115 are controlled by the controller 135. As the image sensor 115, various image sensors such as a CMOS image sensor, a CCD image sensor, and an NMOS image sensor are available.

The image sensor 115 performs imaging operation for a moving image or a still image, and imaging operation for a through image. The through image is mainly a moving image, to be displayed on the display monitor 130 so that a user determines a composition for capturing a still image, for example. The through image, the moving image, and the still image are each an example of captured images in the present embodiment. The image sensor 115 is an example of an imager in the present embodiment.

The image processing engine 120 is configured to perform various processes on imaging data output from the image sensor 115 to generate image data, and perform various processes on the image data to generate an image to be displayed in the display monitor 130. The various processes include white balance correction, gamma correction, YC conversion processing, electronic zoom processing, compression processing, expansion processing, and the like, but not limited thereto. The image processing engine 120 may be composed of a hard-wired electronic circuit, or may be composed of a microcomputer or a processor, using a program.

In the present embodiment, the image processing engine 120 includes an image recognizer 122 that realizes a function of detecting subjects with various types such as a person and an animal using image recognition of a captured image. Details of the image recognizer 122 will be described later.

The display monitor 130 is an example of a display that displays various kinds of information. For example, the display monitor 130 displays an image (through image) which is indicated by image data captured by the image sensor 115, and which is subjected to image processing by the image processing engine 120. The display monitor 130 also displays a menu screen or the like for a user to make various kinds of setting for the digital camera 100. The display monitor 130 can be composed of a liquid crystal display device or an organic EL device, for example.

The operation member 150 is a general term for hard keys such as an operation button and an operation lever provided on the exterior of the digital camera 100, to receive an operation by a user. The operation member 150 includes a release button, a mode dial, and a touch panel, for example. When receiving an operation by the user, the operation member 150 transmits an operation signal corresponding to the operation by the user to the controller 135.

The controller 135 entirely controls the whole operation of the digital camera 100. The controller 135 includes a CPU and the like, and the CPU executes a program (software) to realize a predetermined function. The controller 135 may include a processor including a dedicated electronic circuit designed to realize a predetermined function instead of the CPU. That is, the controller 135 can be implemented by various kinds of preprocessor, such as a CPU, an MPU, a CPU, a DSU, an FPGA, and an ASIC. The controller 135 may be composed of one or more processors. The controller 135 also may be integrated in one semiconductor chip together with the image processing engine 120 and the like.

The buffer memory 125 is a recording medium that functions as a work memory for the image processing engine 120 and the controller 135. The buffer memory 125 is implemented by a dynamic random access memory (DRAM) or the like. The flash memory 145 is a non-volatile recording medium. Although not illustrated, the controller 135 may have various internal memories, such as a ROM incorporated. The ROM stores various programs to be executed by the controller 135. The controller 135 also may incorporate a RAM that functions as a work area of the CPU.

The card slot 140 is a means into which a removable memory card 142 is inserted. The card slot 140 is electrically and mechanically connectable to the memory card 142. The memory card 142 is an external memory provided inside with a recording element such as a flash memory. The memory card 142 can store data such as image data generated by the image processing engine 120.

The communication module 155 is a communication module (circuit) that performs data communication according to the communication standard such as IEEE802.11, the Wi-Fi standard, or the like. The digital camera 100 can communicate with other devices using the communication module 155. The digital camera 100 may communicate directly with other devices using the communication module 155 or may perform communication via an access point. The communication module 155 may be connectable to a communication network such as the Internet.

The microphone 160 is an example of a sound collector that collects sound. The microphone 160 converts the collected sound into an analog signal that is an electrical signal and outputs the analog signal. The microphone 160 may be composed of one or more microphone elements.

The microphone A/D converter 165 converts the analog signal from the microphone 160 into audio data on a digital signal. The microphone A/D converter 165 is an example of an audio input device in the present embodiment. The microphone 160 may include a microphone element outside the digital camera 100. In this case, the digital camera 100 includes an interface circuit for the external microphone 160 as the audio input device.

The audio processing engine 170 receives audio data output from the audio input device such as the microphone A/D converter 165 and performs various kinds of audio processing on the received audio data. The audio processing engine 170 is an example of an audio processor in the present embodiment. The audio processing engine 170 may be implemented integrally with the image processing engine 120. Details of a configuration of the audio processing engine 170 will be described later.

1-1-1. Image Recognizer

Details of the image recognizer 122 in the present embodiment will be described below.

The image recognizer 122 employs a trained model using a neural network such as a convolutional neural network, for example. The image recognizer 122 inputs image data from the image sensor 115 to the trained model, to execute image recognition processing using the model. The image recognizer 122 outputs detection information indicating a detection result of a type of a subject acquired by the image recognition processing. The image recognizer 122 is an example of a detector in the present embodiment. The image recognizer 122 may be implemented by cooperation of the image processing engine 120 and the controller 135.

The image recognizer 122 executes the image recognition processing to obtain position information indicating a region where a subject classified into any one of preset categories is shown in an image indicated by the data input to the trained model, and to output detection information associating the position information with a corresponding category, for example. The categories include types such as "person" and "animal", for example. Each of the categories may be further subdivided, and may include human parts such as a body, a face, and an eye of a person, and animal parts such as a body, a face, and an eye of an animal, for example. The position information is defined by horizontal coordinates and vertical coordinates in the image to be processed, for example, indicating a region surrounding a detected subject in a rectangular shape (refer to FIG. 5A, etc.), for example.

The image recognizer 122 may simultaneously detect subjects up to a preset maximum number for each of the categories. The category (or type) of animal described above may be further classified according to a kind of animal. For example, categories such as dogs, cats, and birds may be set separately, or a category into which dogs and cats are combined may be set. Hereinafter, a case will be described in which the plurality of types preset in the digital camera 100 includes the type "person" as an example of a first type, and the type "cat" as an example of a second type.

The trained model of the image recognizer 122 described above can be obtained by supervised learning using, as training data, image data in association with a correct label defined such that an image shown with a subject of the corresponding one of the categories is correct, for example. Using the trained model, reliability or likelihood may be generated for a detection result of each of the categories.

The trained model the image recognizer 122 is not limited to a neural network, and may be a machine learning model related to various kinds of image recognition. The image recognizer 122 is not limited to the machine learning, and may employ various image recognition algorithms. The image recognizer 122 may be configured such that detection for some categories such as a face and an eye of a person is performed using rule-based image recognition processing.

1-1-2. Audio Processing Engine

Figure 2:
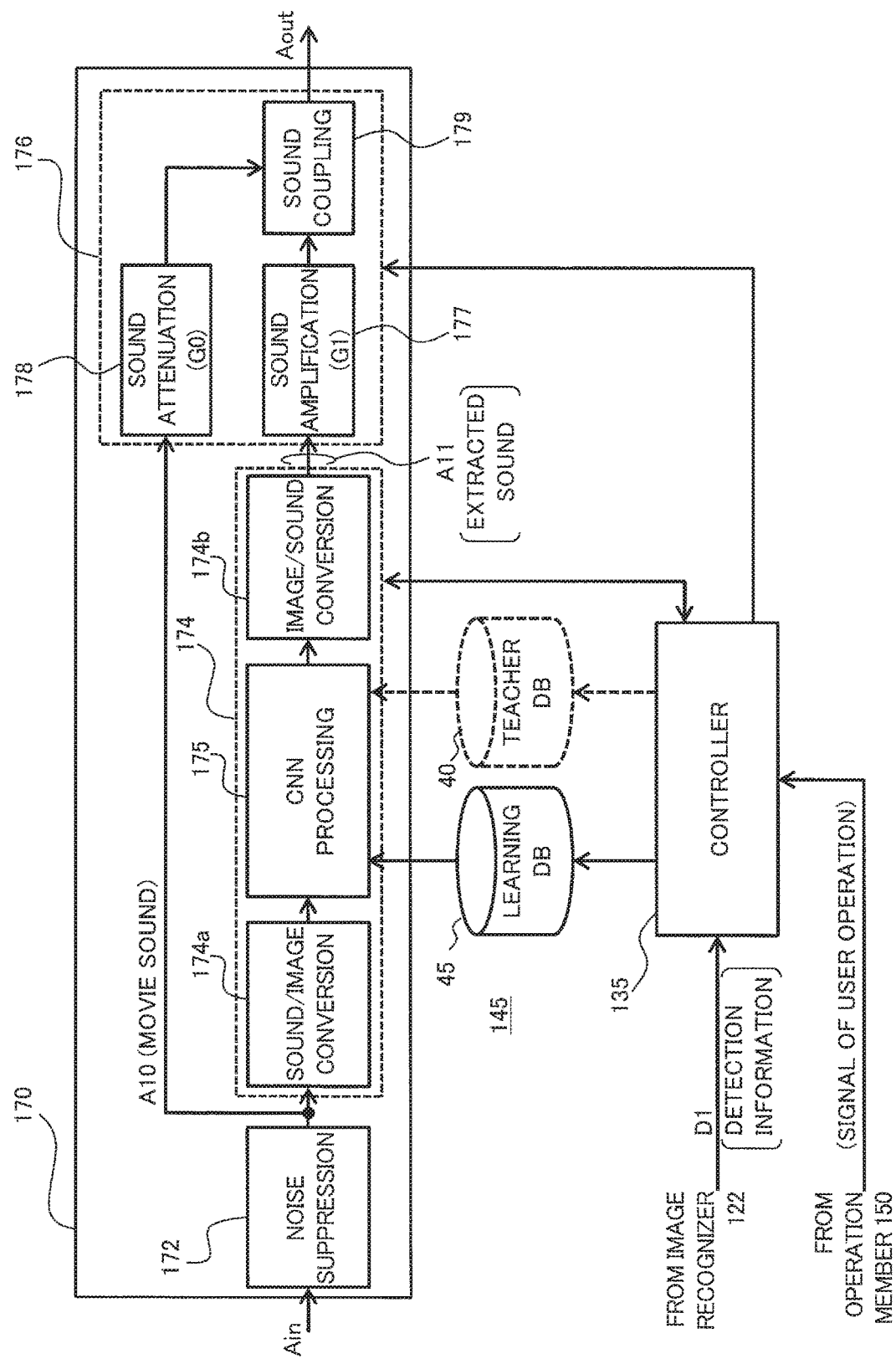
FIG. 2 is a block diagram illustrating a configuration of an audio processing engine in the digital camera.

Details of a configuration of the audio processing engine 170 will be described with reference to FIGS. 2 to 4. FIG. 2 is a block diagram illustrating a configuration of the audio processing engine 170 in the digital camera 100.

The audio processing engine 170 has a functional configuration including, for example, a noise suppression unit 172, a sound extraction unit 174, and an emphasis processing unit 176, as illustrated in FIG. 2. The audio processing engine 170 receives audio data Ain from the microphone A/D converter 165 to perform audio processing using various functions. The sound extraction unit 174 and the emphasis processing unit 176 are controlled by the controller 135, for example.

The noise suppression unit 172 performs processing of suppressing noise sound on the audio data Ain received by the audio processing engine 170. The noise suppression unit 172 performs the processing to suppress predetermined noises such as a wind sound, a driving sound of a lens and the like, and various handling noises generated when a user touches the digital camera 100, for example. Such processing can be executed by a rule-based algorithm, for example. The noise suppression unit 172 outputs processed audio data A10 to the sound extraction unit 174 and the emphasis processing unit 176. The audio data A10 processed by the noise suppression unit 172 indicates movie sound, that is, sound in a moving image obtained when the moving image is captured without performing sound extraction, for example.

The sound extraction unit 174 performs processing of extracting a voice of a specific type (hereinafter may be referred to as a "target type") on the audio data A10 on the movie sound from the noise suppression unit 172, and outputs audio data A11 indicating an extracted sound. The processing of the sound extraction unit 174 is implemented by a trained model by machine learning such as a neural network. In the following, an example using a convolutional neural network (CNN) will be described.

The CNN of the sound extraction unit 174 includes a convolution layer that receives image data as input, for example, like that being used for image recognition. In the present example, the sound extraction unit 174 includes a sound/image conversion unit 174a that converts audio data on the movie sound into image data, a CNN processing unit 175 that executes processing using a CNN to identify a portion corresponding to a specific type in the converted image data, and an image/sound conversion unit 174b that converts image data on the identified portion into audio data. The sound extraction unit 174 can operate periodically at a predetermined frame period, for example.

In the audio processing engine 170, a plurality of types settable as target types is preset. The plurality of types in the audio processing engine 170 corresponds to the plurality of types preset in the image recognizer 122, for example. FIGS.

3A and 3B are as diagram showing an example of data on a specific type in the sound extraction unit 174.

Figure 3A:
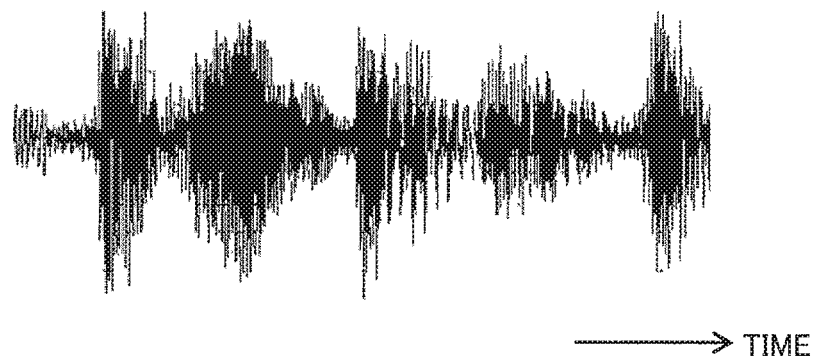
FIGS. 3A and 3B are diagrams showing an example of data on a specific type in a sound extraction unit of the audio processing engine.
Figure 3B:
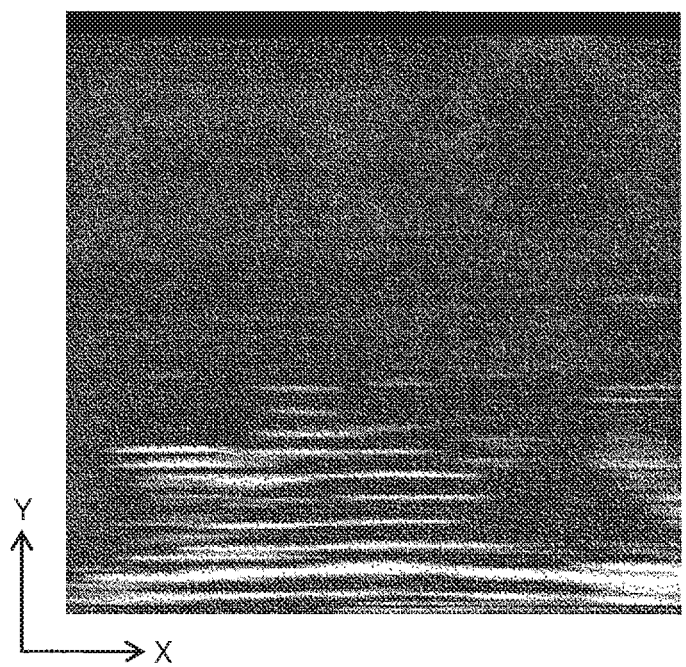

FIG. 3A exemplifies a sound waveform based on audio data A12 of a human voice as a data example of the type "person". FIG. 3B exemplifies image data B12 after conversion of the audio data A12 of FIG. 3A. As exemplified in FIG. 3A, the audio data A12 constitutes time-series data in which the sound waveform has an amplitude defined along a time direction. The sound/image conversion unit 174a calculates short-time Fourier transform (STFT), for example, to generate the image data B12 after conversion of the audio data A12.

As shown in FIG. 3B, the converted image data B12 indicates a spectrogram or a voiceprint image of the audio data A12, and has a frequency direction Y in addition to a time direction X. The image data B12 has a pixel value indicating intensity (amplitude) of a sound component defined by (X, Y) coordinates. A region in an image of the image data B12 indicates a corresponding time section and a frequency band component in the audio data A12 before being converted.

Figure 4A:
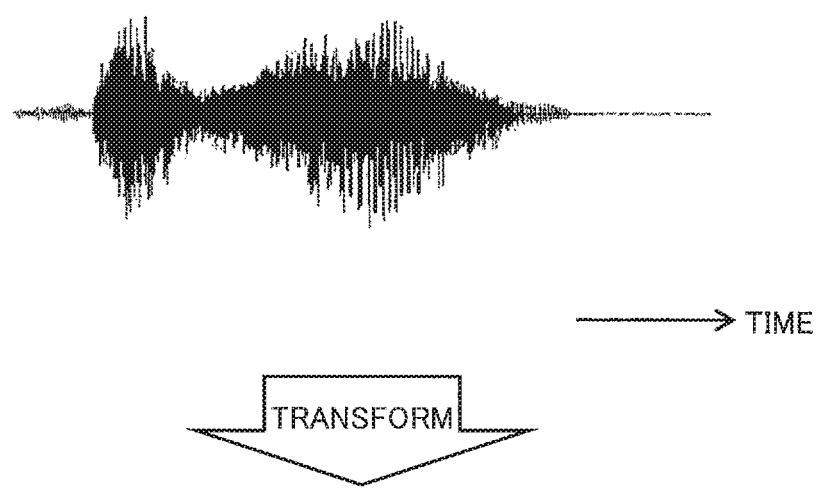
FIGS. 4A and 4B are diagrams showing an example of data on a type different from that in FIGS. 3A and 3B in the sound extraction unit.
Figure 4B:
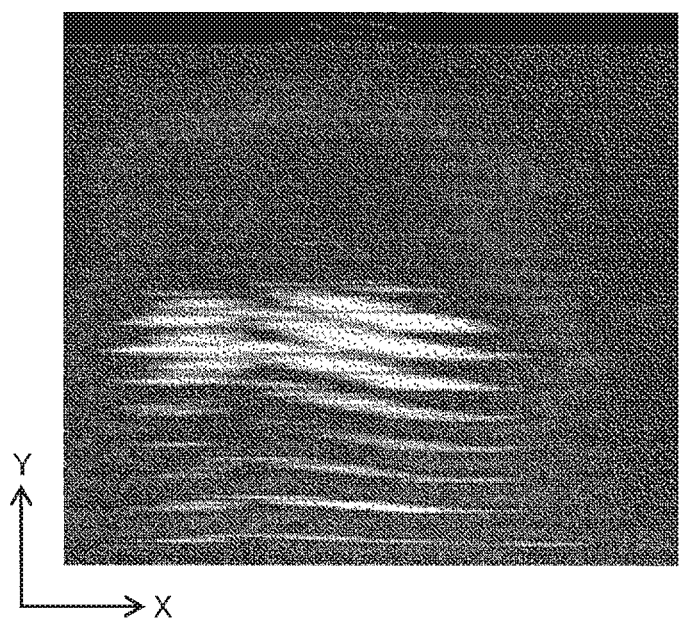

FIGS. 4A and 4B are diagrams showing an example of data on a type different from that in FIGS. 3A and 3B. FIG. 4A exemplifies a sound waveform based on audio data A13 on sound of mewing by a cat as a data example of the type "cat". FIG. 4B exemplifies image data B13 after conversion of the audio data A13 of FIG. 4A. The image data B12 and B13 shown in FIGS. 3B and 4B, respectively, include different feature values in accordance with types in the audio data A12 and A13 in FIGS. 3A and 4A, respectively. According to the machine learning of the CNN processing unit 175, a method for identifying a feature value as described above is obtained.

For example, multiple image data as training data, labeled with the image data B12 and B13 corresponding to sounds of various types, is stored in a teacher database (DB) 40 for machine learning of the CNN processing unit 175. A trained model of the CNN processing section 175 can be configured by adjusting a weight parameter group of the CNN using a back propagation method to reduce an error between input data and training data in supervised learning using the teacher DB40 such that when image data is input, identification information on a specific type is output. The teacher DB 40 may store audio data instead of image data. In this case, the conversion of the sound/image conversion unit 174a can be applied to rue audio data in the teacher DB 40.

The CNN processing unit 175 outputs identification information that includes image data indicating a region identified corresponding to a specific type in input image data, for example, and that may include reliability or likelihood of this identification. The CNN processing unit 175 may include various generation models that generate image data or the like corresponding to a sound for each type, for example, in addition to or instead of the CNN described above. The CNN processing unit 175 can use trained models that are machine-learned separately for respective types. For example, the trained models for the respective types or corresponding weight parameter groups are stored in a learning database (DB) 45 in the flash memory 145, and are set in the CNN processing unit 175 as needed by the controller 135 as setting information to be used for extracting a sound of a specific type. The CNN processing unit 175 may use a trained model that simultaneously identifies the plurality of types.

Returning to FIG. 2, the image/sound conversion unit 174b calculates reverse conversion of the STFT calculated by the sound/image conversion unit 174a, for example. The image/sound conversion unit 174b calculates the reverse conversion on the image data identified by the CNN processing unit 175, to generate the audio data. All on an extracted sound indicating an extraction result in the sound extraction unit 174.

The emphasis processing unit 176 includes a sound amplification unit 177 that receives the audio data A11 on the extracted sound from the sound extraction unit 174, a sound attenuation unit 178 that receives the audio data A10 on the movie sound from the noise suppression unit 172, and a sound coupling unit 179 that integrates outputs of the sound amplification unit 177 and the sound attenuation unit 178. The emphasis processing unit 176 processes the audio data A10 and A11 of the extracted sound and the movie sound so that the extracted sound from the sound extraction unit 174 is emphasized from the movie sound. Then, audio data Aout as a processing result by the audio processing engine 170 is output.

The sound amplification unit 177 performs multiplication processing of multiplying a gain G1 set by the controller 135 on the input audio data A11, for example, to amplify the extracted sound. The sound attenuation unit 178 multiplies the input audio data A10 by a gain G0(<1) to suppress the movie sound, the gain G1 having a value causing a volume of the movie sound indicated by the audio data A10 to be equal to a sound volume of coupling result by the sound coupling unit 179. The sound coupling unit 179 synthesizes the extracted sound amplified and the suppressed voice in the moving image in synchronization with each other, to generate the audio data Aout as the processing result.

The gain G0 of the sound attenuation unit 178 may be calculated by the emphasis processing unit 176 or may be set by the controller 135. The sound amplification unit 177 may have a gain G1 equal to or less than one, for example. Even in this case, the movie sound includes the same sound as the extracted sound, so that the voice to be extracted is amplified more than the movie sound in the audio data Aout as the processing result.

In the audio processing engine 170 as described above, the function of the sound extraction unit 174 may be realized using not only the CNN, but also another neural network, or may be realized using a machine learning model related to various sound identification other than the neural network. In addition, the machine learning of the sound extraction unit 174 using the teacher DB 40 or the like may be performed preliminarily before being mounted on the digital camera 100. In this case, as long as a learning DB 45 of learning results is recorded in the flash memory 145 of the digital camera 100, the teacher DB 40 may not be recorded therein.

In the audio processing engine 170, an extraction result of the sound extraction unit 174 may be corrected using a database including audio data associated with various types such as the teacher DB 40. For example, the database may be stored in the flash memory 145, and the audio processing engine 170 may match an extraction result of the sound extraction unit 174 with data in the database. In addition, the functions of the sound extraction unit 174 and the like are not limited to machine learning, and may be realized by various sound identification algorithms, and search in the database as described above may be used.

1-2. Operation

Operation of the digital camera 100 configured as described above will be described. Hereinafter, operation at the time of shooting a moving image using the digital camera 100 will be described.

The digital camera 100 generates imaging data such that the image sensor 115 sequentially captures a subject image formed using the optical system 110. The image processing engine 120 performs various kinds of processing on the imaging data generated by the image sensor 115 to generate image data, and records it in the buffer memory 125. The image recognizer 122 of the image processing engine 120 detects a type and a region of the subject based on an image indicated by the imaging data, and outputs detection information D1 to the controller 135, for example.

In parallel with the above imaging operation, the digital camera 100 collects sound with the microphone 160. The audio processing engine 170 processes audio data of the sound collection result from the microphone A/D converter 165. The audio processing engine 170 records the processed audio data rout in the buffer memory 125.

Via the buffer memory 125, the controller 135 brings image data received from the image processing engine 120 into synchronism with audio data received from the audio processing engine 170 to record a moving image in the memory card 142. In addition, the controller 135 sequentially causes the display monitor 130 to display a through image. A user can check a composition and the like of shooting at any time from the through image on the display monitor 130. Operation of shooting the moving image is started and finished in response to user operation on the operation member 150.

Shooting the moving image by the digital camera 100 as described above may be done with the user being interest in a specific type of subject such as "person" or "animal". In this case, a demand for the sound is also conceivable to clearly collect specific sound based on the same type as the above.

The digital camera 100 according to the present embodiment detects a type of a subject based on the detection information D1 of the image recognizer 122 in the image processing engine 120. When a specific type of subject is detected in image recognition, the audio processing engine 170 executes processing of extracting sound specific to the type. In this way, image recognition of the image processing engine 120 can be trigger of sound extraction and the like of the audio processing engine 170, to achieve accurate extraction of sound of a subject with a specific type.

Hereinafter, an operation example of the digital camera 100 in an operation mode (hereinafter referred to as "person-priority mode") in which a specific type as described above is set to "person" will be described.

1-2-1. Person-Priority Mode

Figure 5A:
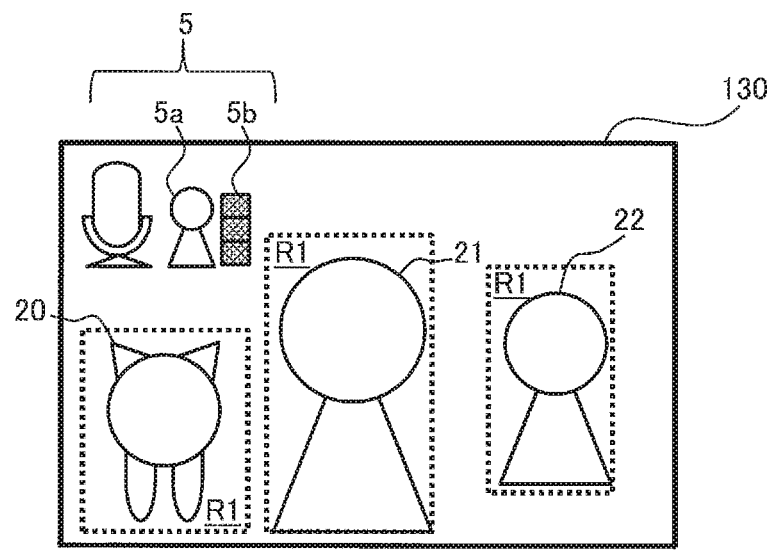
FIGS. 5A and 5B are diagrams for illustrating an outline of a person-priority mode of the digital camera according to the first embodiment.
Figure 5B:
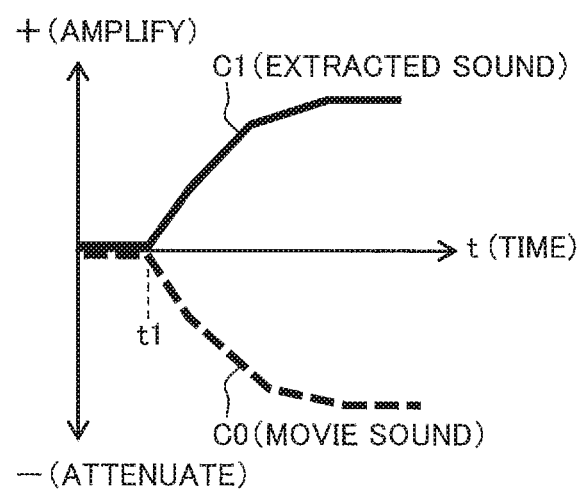

FIGS. 5A and 5B are diagrams for illustrating an outline of a person-priority mode of the digital camera 100. The person-priority mode is an operation mode for paying attention to a subject of the type "person" in shooting a moving image, for example.

FIG. 5A illustrates an example of display on the display monitor 130 in the person-priority mode. The controller 135 of the digital camera 100 causes the display monitor 130 to display a through image and a detection region R1 indicating where a subject is detected with a frame expression or the like in the through image. In the example of FIG. 5A, the display monitor 130 displays a sound extraction icon 5. The sound extraction icon 5 includes a target type mark 5a indicating a type of a subject of sound extraction, and an amplification level bar 5b indicating a level at which the extracted sound is amplified. The target type mark 5a (an example of target type information) and the amplification level bar 5b (an example of emphasis level information) are each displayed under control of the controller 135. The sound extraction icon 5 in the person-priority mode includes a "person" mark displayed as the target type mark 5a.

The digital camera 100 in the person-priority mode causes the image recognizer 122 in the image processing engine 120 to detect various types of subject, for example. In the example of FIG. 5A, detected subjects are persons 21 and 22 of a target type and a cat 20 of a type different from the target type. At this time, the sound extraction unit 174 in the audio processing engine 170 operates in response to detection of the persons 21 and 22 by image recognition to start sound extraction processing for the target type "person".

FIG. 5B is a graph exemplifying change in sound, corresponding to FIG. 5A. In FIG. 5B, the horizontal axis represents time, and the vertical axis represents amplification (or suppression) level. A curve C1 represents an extracted sound, and a curve C0 represents the movie sound. When any one of the persons 21 and 22 makes a voice and voice sound specific to the type "person" is extracted, the emphasis processing unit 176 amplifies the extracted sound. On the other hand, sound of mewing "cat" is not a subject of sound extraction. In this way, the sound of the target type "person" intended by a user is clearly obtained with priority over other sound.

The emphasis processing unit 176 of the audio processing engine 170 gradually increases the extracted sound as indicated by the curve C1 in FIG. 5B. This enables avoiding a steep change in sound that causes a user to be uncomfortable to hear a sound after being emphasized. In addition, the audio processing engine 170 amplifies an extracted sound and suppresses the movie sound so that a total volume is kept constant over before and after processing by the emphasis processing unit 176. This enables a user to easily hear a sound after being emphasized. The user also can check a level of amplification of the extracted sound with the amplification level bar 5b in FIG. 5A. In addition, the target type mark 5a enables the user to check a current target type, and easily achieving sound emphasis intended by the user.

1-2-2. Details of Operation

Details of the operation of the digital camera 100 in the person-prior mode as described above will be described with reference to FIGS. 6 and 7. For example, when a user intends to clearly obtain a sound of a subject of the type "person", the user can set the digital camera 100 to the person-priority mode by inputting user operation to the operation member 150 such as a touch panel or various keys in a setting menu or the like of the digital camera 100.

Figure 6:
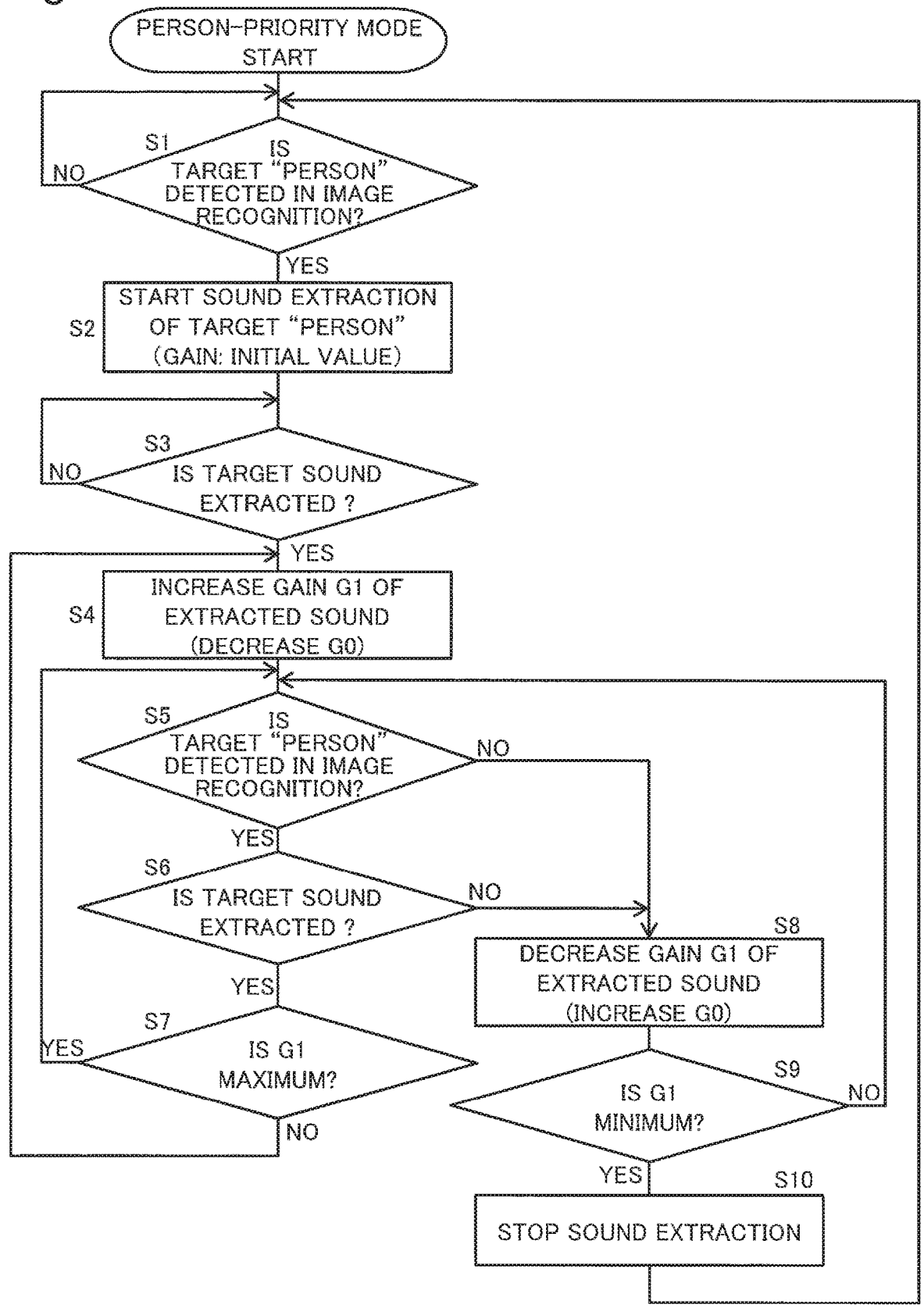
FIG. 6 is a flowchart exemplifying an operation of the digital camera according to the first embodiment.

FIG. 6 is a flowchart exemplifying an operation of the digital camera 100 according to the first embodiment. The flowchart illustrated in FIG. 6 is executed during shooting of a moving image with the digital camera 100 set to the person-priority mode, for example. In this state, the display monitor 130 displays the target type mark 5a indicating the type "person" under control of the controller 135. Each process according to the present flowchart is executed by the controller 135 of the digital camera 100, for example. Instead of the controller 135, a function for executing the following processes may be implemented in the audio processing engine 170.

First, the controller 135 acquires the detection information D1 from the image processing engine 120, and determines whether a subject of the type "person" is detected in the image recognizer 122 (S1). Until a subject of type "person" is detected, the controller 135 repeats the determination in step S1 at a predetermined period, for example (NO in S1). The period is an operation period of the image recognizer 122 in the image processing engine 120, for example.

In step S1, the audio processing engine 170 generates audio data A10 processed by the noise suppression unit 172 without executing a process of the sound extraction unit 174 (FIG. 2). Thus, the audio data A10, output to the buffer memory 125, is not particularly suppressed by the emphasis processing unit 176 (G0=1).

When the subject of type "person" is detected in image recognition (YES in S1), the controller 135 causes the audio processing engine 170 to start sound extraction of the target type "person" (S2). The controller 135 refers to the learning DB 45 to set setting information for performing sound extraction of the target type "person" in the sound extraction unit 174 in the audio processing engine 170. The controller 135 sets the gain G1 of the sound amplification unit 177 in the emphasis processing unit 176 to an initial value, for example. The initial value of the gain G1 is set to a value that is expected that a user does not feel a steep change in sound volume.

The controller 135 determines whether a sound of the target type is extracted by the sound extraction unit 174 in the audio processing engine 170 (S3). The determination in step S3 is made based on reliability of identification information output from the CNN processing unit 175 in the sound extraction unit 174, for example. Until it determines that a sound of the target type "person" is extracted, the controller 135 repeats the determination in step S1 at a predetermined period, for example (NO in S3). The period is an operation period of the sound extraction unit 174 in the audio processing engine 170, for example.

In the audio processing engine 170 after step S2, the sound extraction unit 174 extracts a sound of the target type, and successively the sound amplification unit 177 in the emphasis processing unit 176 amplifies the extracted sound. At this time, the gain G1 set previously is used sequentially in the sound amplification unit 177. For example, gain G1 with the initial value is applied to the sound extracted in step S3. The sound attenuation unit 178 of the emphasis processing unit 176 uses the gain G0 with a value for conserving a sound volume in accordance with the gain G1 set in the sound amplification unit 177.

When determining that the sound of the target type "person" is extracted (YES in S3), the controller 135 increases the gain G1 of the sound amplification unit 177 from the initial value (S4). Accordingly, the increased gain G1 is applied to the next extracted sound. In step S4, the gain G1 may be increased at a predetermined pitch or may be increased continuously. In step S4, the controller 135 causes the display monitor 130 to increase the level indicated by the amplification level bar 5b in accordance with the increase in the gain G1 (refer to FIGS. 5A and 5B).

Next, the controller 135 acquires the detection information D1 again from the image recognizer 122, and determines whether a subject of the target type "person" is detected at the present time (S5). The determination in step S5 is performed similarly to that in step S1.

When determining that the subject of the target type "person" is detected (YES in S5), the controller 135 determines whether a sound of the target type is extracted by the sound extraction unit 174 at the present time (S6), as in step S3.

When the sound of the target type of is extracted (YES in S6), the controller 135 determines whether the gain G1 set in the sound amplification unit 177 is a maximum value (S7). For example, the maximum value is set to a value that allows a user to feel that the extracted sound is sufficiently emphasized. When the set gain G1 does not reach the maximum value (NO in S7), the controller 135 again increases the gain G1 of the sound amplification unit 177 (S4), and performs the processes in and after step S5 again. Accordingly, the gain G1 further increased is applied to a newly extracted sound.

On the other hand, when the gain G1 is the maximum value (YES in S7), the controller 135 performs the processes in and after step S5 again without performing the process in step S4. This enables amplification emphasizing an extracted sound in the audio processing engine 170 to be kept with an appropriate gain G1.

When no subject of the type "person" is detected at the present time (NO in S5) or no sound of a target type is extracted (NO in S6), the controller 135 reduces the gain G1 of the sound amplification unit 177 (S8). The process in step S8 is performed at the same pitch as in step S4, for example. In step S8, the controller 135 causes the display monitor 130 to lower the level indicated by the amplification level bar 5b in accordance with the decrease in the gain G1 (refer to FIGS. 7A and 7B).

The controller 135 determines whether the reduced gain G1 is a minimum value (S9). The minimum value of the gain G1 may be the same value as the initial value, for example. When the gain G1 does not reach the minimum value (NO in S9), the controller 135 performs the processes in and after step S5 again. Accordingly, when the sound extraction unit 174 extracts a sound of the target type in the subsequent step S6, the sound is amplified by using the reduced gain G1. On the other hand, when the gain G1 reaches the minimum value (YES in S9), the controller 135 stops a process of sound extraction by the sound extraction unit 174 (S10), and processing returns to step S1.

The processes above are repeatedly executed during shooting the moving image in the person-priority mode of the digital camera 100, for example. As a record of the moving image, the audio data Aout on an audio-processed sound is recorded.

According to the processes above, extraction of a sound and amplification of the extracted sound are executed in conjunction with image recognition of a specific type, such as "person".

For example, before time t1 in the example of FIG. 5B, no subject of the type "person" is detected (NO in S1), and thus extraction, amplification, and suppression of a sound are not performed. In this way, even in the person priority mode, during a time period when no subject of the type "person" is detected in the image recognition, no audio processing for the target type is performed. Thus, unnecessary reduction in sound in the moving image can be avoided.

When the image recognizer 122 detects a subject of the type "person" (YES in S1) and the sound extraction unit 174 starts extracting a sound of the target type (YES in S3), the controller 135 gradually increases the gain G1 of the sound amplification unit 177 (S2 to S7). Accordingly, emphasis of the extracted sound gradually proceeds from time t1 in FIG. 5B. This enables obtaining a sound which is ease for the user to hear even before and after timing of starting amplification.

FIGS. 7A to 7D are diagrams illustrating an operation example when a "person" moves in the person-priority mode of the digital camera 100. The digital camera 100 in the person-priority mode continues the sound extraction as long as at least one person of the type "person" is recognized in an image.

Figure 7A:
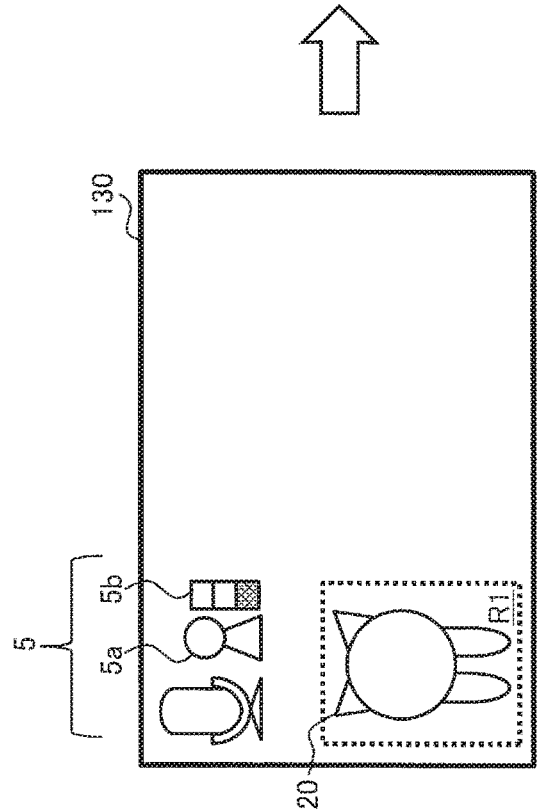
FIGS. 7A to 7D are diagrams illustrating an operation example when a "person" moves in the persons-priority mode of the digital camera.
Figure 7B:
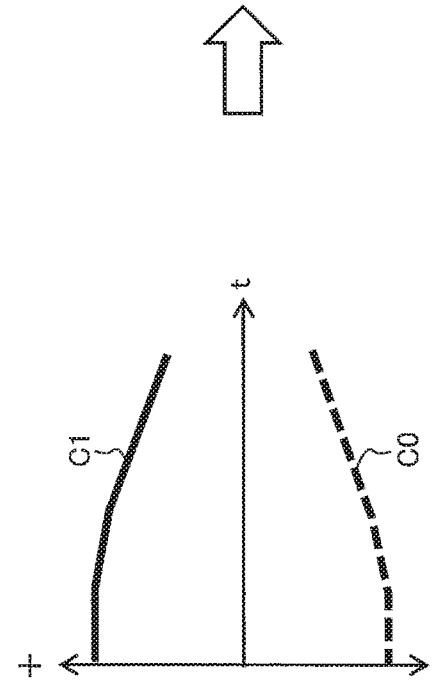

FIG. 7A illustrates a display example subsequent to FIG. 5A. FIG. 7B exemplifies change in sound corresponding to FIG. 7A. In this example, none of the persons 21 and 22 is present, and thus the type "person" is not detected in the image recognition (NO in S5). At this time, the sound extraction is not stopped immediately, but the controller 135 gradually reduces the gain G1 of the sound amplification unit 177 (S7, S8), for example.

Figure 7C:
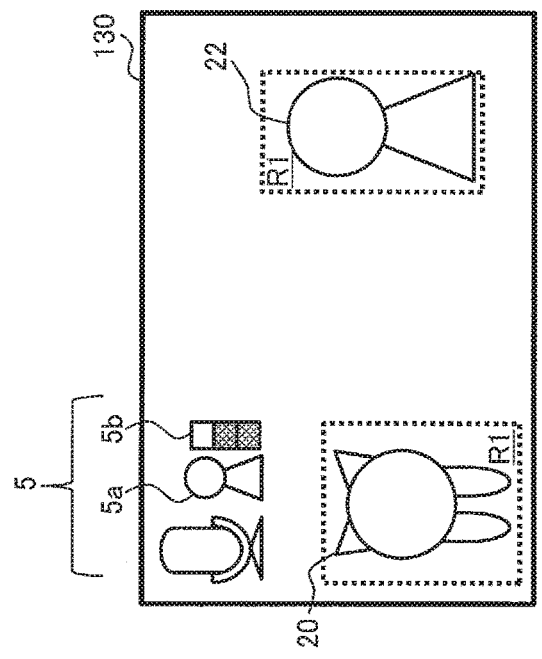
Figure 7D:
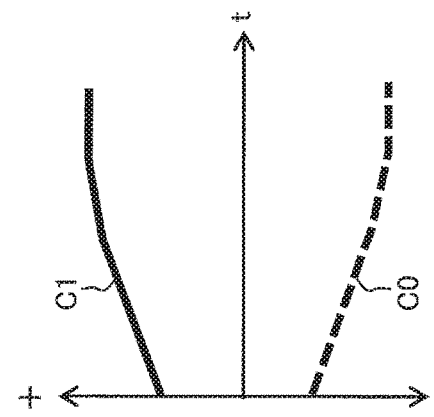

FIG. 7C illustrates a display example subsequent to FIG. 7A. FIG. 7D exemplifies change in sound corresponding to FIG. 7C. In the example of FIG. 7C, the person 22 is detected again subsequent to FIG. 7A, and thus the gain G1 of the sound amplification unit 177 is increased again (S4 to S8). As described above, even in a situation where a subject of the person 22 or the like moves, a clearer sound can be obtained without rapidly changing the extracted sound.

In the above description, the example of emphasizing a sound of a target type is described. Instead of this, a sound of a target type may be suppressed. For example, when a user wants to suppress a sound of a person, the user selects an operation mode instead of the person-priority mode described above. In this operation mode, for example, the audio processing engine 170 can suppress the sound of the target type by performing processing in which amplification and suppression of sound are interchanged with each other in the flowchart of FIG. 6. This enables achieving sound clarification in accordance with a user's intention to suppress a sound of a specific type.

While in the above description, the operation example with a target type being the type "person" is described, similar operation is available for other types. For example, the digital camera 100 may have operation modes each employing any one of a plurality of types as a target type that can be set in the image recognizer 122 and the audio processing engine 170. For example, a user operation may be input from the operation member 150 in a state that an option for each operation mode is displayed in a setting menu on the display monitor 130, and then an operation mode corresponding to a target type desired by the user may be selected.

1-3. Summary

As described above, the digital camera 100 according to the first embodiment includes the image sensor 115 as an example of the imager, the microphone A/D converter 165 as an example of the audio input device, the image recognizer 122 as an example of the detector, the audio processing engine 170 as an example of the audio processor, and the operation member 150. The image sensor 115 is configured to capture a subject image to generate image data. The microphone A/D converter 165 is configured to receive audio data Ain indicating a sound during shooting using the image sensor 115. The image recognizer 122 is configured to detect a subject and its type based on image data generated by the image sensor 115. The audio processing engine 170 is configured to process the received audio data Ain based on the type of the subject detected by the image recognizer 122. The operation member 150 is configured to set a target type among a plurality of types based on various operations of the digital camera 100 performed by a user. The target type indicate a type to be processed by the audio processing engine 170. The plurality of types include a first type related to a person and a second type different from the first type, for example. When a subject of the target type is detected in the image data (S1), the audio processing engine 170 causes the sound extraction unit 174 and the emphasis processing unit 176 to process the audio data Ain to emphasize or suppress specific sound corresponding to the target type in the received audio data Ain (S2 to S4).

According to the digital camera 100 described above, when a specific subject corresponding to the target type desired by the user is detected in the image recognition of the image data using the image sensor 115, audio data Aout in which sound corresponding to the type of the specific subject is emphasized or suppressed is obtained. This enables specific sound such as a voice of the specific subject to be easily and clearly obtained according to a user's intention.

In the present embodiment, the digital camera 100 further includes the display monitor 130 as an example of the display configured to display an image indicated by image data. The display monitor 130 is configured to display the target type mark 5a that is an example of the target type information indicating a target type. This enables a user to check a current target type at any time when shooting a moving image or the like, so that acquisition of a sound of a subject according to a user's intention can be easily achieved. The display monitor 130 may further display the amplification level bar 5b that is an example of the emphasis level information indicating a level at which a voice of a subject is emphasized or suppressed.

In the present embodiment, the digital camera 100 includes the operation member 150 configured to receive user operation. The target type to be processed by the audio processing engine 170 can be set based on a user operation on the operation member 150. This enables a sound of a type desired by a user to be easily and clearly obtained.

In the present embodiment, the digital camera 100 has operation modes including the person-priority mode for the type "person" as an example of a specific operation mode preset one of the plurality of types for a subject. The operation member 150 is configured to set a target type in accordance with a user operation for selecting the specific operation mode among the operation modes of the digital camera 100. For example, when the person-priority mode is selected, a target type is set to "person". Such an operation mode is not limited to the person-priority mode. For example, an operation mode that prioritizes various types of animal, such as "cat" may be used instead of the type "person".

In the present embodiment, the audio processing engine 170 is configured to gradually increase the gain G1 (S3 to S7) from a timing when the image recognizer 122 detects a subject of the target type (YES in S2). The gain G1 is one example of an amplification factor emphasizing specific sound corresponding to the target type. This enables avoiding a sudden change in sound and the extracted sound emphasized can be ease for user to hear.

In the present embodiment, the audio processing engine 170 is configured to gradually decrease the gain G1 (S8, S9), when the subject of the target type is no longer detected (NO in S5) after the target type is detected by the image recognizer 122. This enables avoiding excessive change in emphasis of an extracted sound depending on whether the subject is detected, and enables obtaining a voice that is ease for user to hear.

In the present embodiment, the audio processing engine 170 is, by the sound extraction unit 174 and the emphasis processing unit 176, configured to process the audio data A10 received by the sound attenuation unit 178 so that a volume is maintained in both the audio data A10 before a process of emphasizing a voice corresponding to the target type and the audio data Aout after the process. This enables obtaining a voice that is easily heard by a user without being changed in volume before and after the audio processing.

In the present embodiment, the digital camera 100 further includes the microphone 160 as an example of the sound collector configured to collect sound. The microphone A/D converter 165 receives audio data Ain indicating a sound collection result of the microphone 160. The microphone 160 is not limited to that built-in the digital camera 100, and may be provided outside the digital camera 100. Even when the external microphone 160 is used, audio data on the sound collection result is received and the audio processing engine 170 performs audio processing in accordance with a detection result received by the image recognizer 122. This enables the digital camera 100 to clearly obtain the sound of a subject of a specific type.

The digital camera 100 of the present embodiment includes the image sensor 115 (imager), the microphone A/D converter 165 (audio input device), the image recognizer 122 (detector), the display monitor 130 (display), the audio processing engine 170 (audio processor), the operation member 150 (operation member), and the controller 135 (processor). The operation member according to the present embodiment is configured to set a target type to be processed by the audio processor among a plurality of types based on a user operation using a setting menu of the imaging apparatus, or the like. The controller 135 is configured to cause the display to display the target type mark 5a as an example of target type information indicating the target type. This also enables a user to check a current target type at any time when shooting a moving image or the like, and thus enables easily and clearly obtaining sound of the subject according to a user's intention.

Second Embodiment

Hereinafter, a second embodiment will be described with reference to FIGS. 8 to 12. While in the first embodiment, the operation example of the person-priority mode of the digital camera 100 is described, in the second embodiment, an operation example of a focus-priority mode will be described. The focus priority mode is an operation mode in which sound extraction is performed with priority given to a type of subject selected as a focus subject, which is to be focused, in the digital camera 100.

Hereinafter, the digital camera 100 according to the present embodiment will be described, while description of configuration and operation similar to those of the digital camera 100 according to the first embodiment will be omitted as appropriate.

2-1. Focus-Priority Mode

FIGS. 8A to 8D are diagrams for illustrating an outline of the focus-priority mode of the digital camera 100. In the digital camera 100 of the present embodiment, for example, a focus subject can be selected by a user operation on the operation member 150 such as a touch panel or a key in a state where the subject is shown in a through image on the display monitor 130.

Figure 8A:
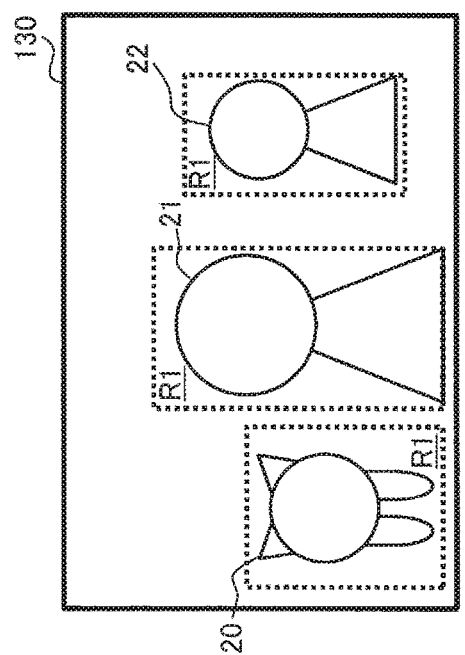
FIGS. 8A to 8D are diagrams for illustrating an outline of a focus-priority mode of a digital camera according to a second embodiment.
Figure 8B:
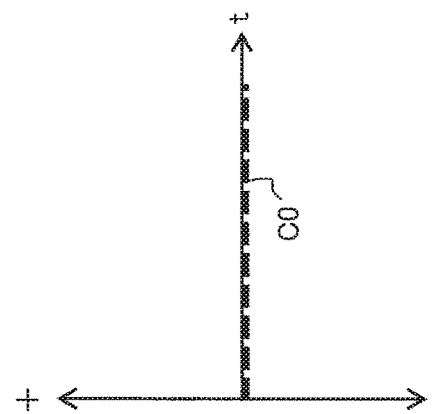
Figure 8C:
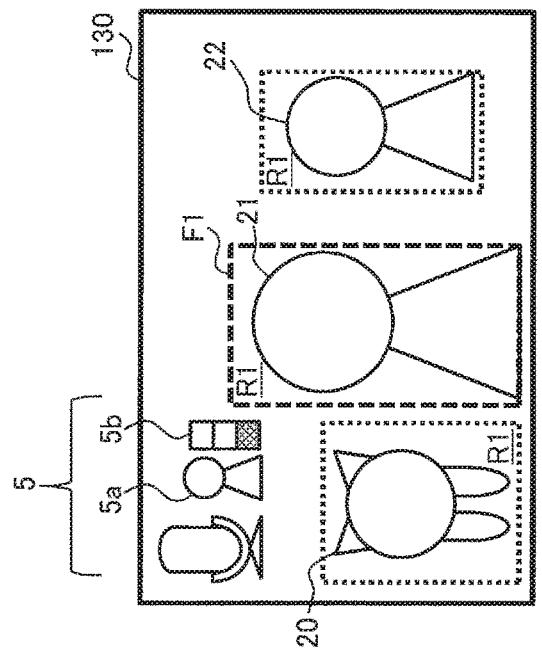
Figure 8D:
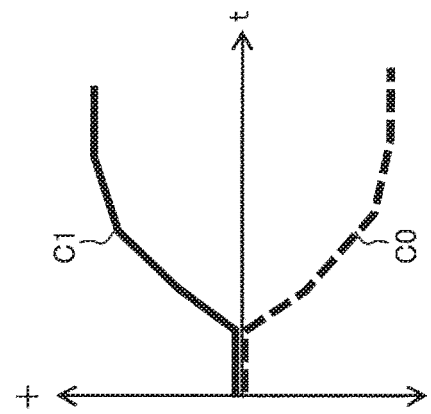

FIG. 8A illustrates a display example before focus selection. FIG. 8B exemplifies change in sound corresponding to FIG. 8A. FIG. 8C illustrates a display example after focus selection. FIG. 8D exemplifies change in sound corresponding to FIG. 8C.

In the display example of FIG. 8A, three subjects of a cat 20 and two persons 21 and 22 are detected by an image recognizer 122 similar to that of the first embodiment. For example, a user can select a focus subject, to be focused, by visually checking indication frames respectively surrounding each subject corresponding to a detection region R1 on the display monitor 130. Before selection of a focus subject, sound extraction is not particularly performed, and the movie sound is obtained as shown by a curve C0 in FIG. 8B.

The display example of FIG. 8C shows an example an which one person 21 is selected as a focus subject from the state of FIG. 8A. The display monitor 130 displays an indication frame F1 for a focus subject around the selected person 21 in a display state different from the indication frames of the other subjects 20 and 22. In addition, the lens driver 112 drives the focus lens of the optical system 110 to focus on the subject in the indication frame F1.

As illustrated in FIG. 8D, the audio processing engine 170 of the present embodiment performs audio processing for emphasizing voice suitable for a type of a focus subject in conjunction with the above operation. The audio processing engine 170 of the present embodiment is configured to be executable of processing extracted sounds of a plurality of types in parallel in the sound extraction unit 174 and the emphasis processing unit 176, for example.

2-2. Details of Operation

Figure 9:
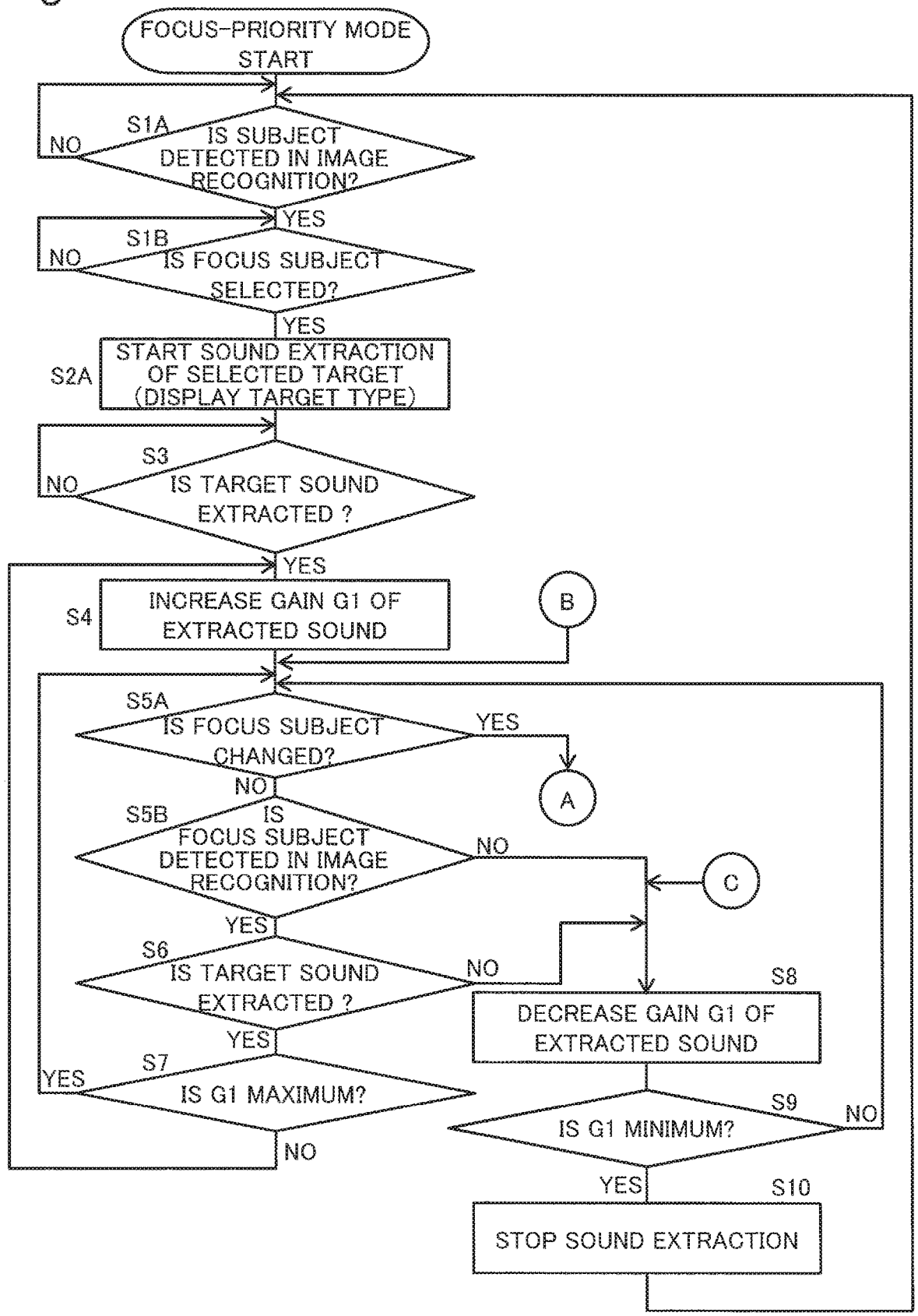
FIG. 9 is a flowchart exemplifying an operation of the digital camera according to the second embodiment.
Figure 10:
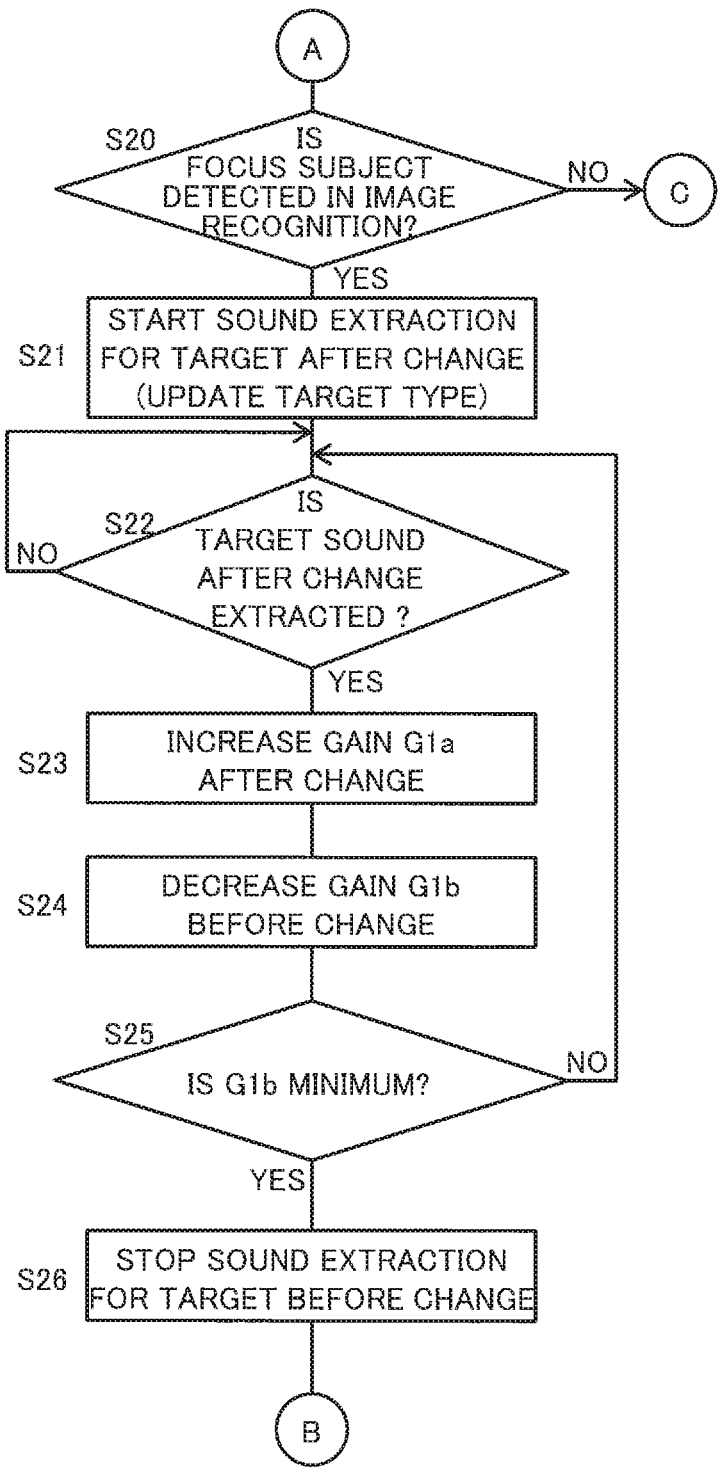
FIG. 10 is a flowchart exemplifying the operation of the digital camera subsequent to FIG. 9.

Details of operation of the digital camera 100 in the focus-priority mode as described above will be described with reference to FIGS. 9 to 12. FIGS. 9 and 10 are each a flowchart exemplifying the operation of the digital camera 100 according to the present embodiment. Hereinafter, description similar to that of the operation in the person-priority mode (FIG. 6) is omitted as appropriate.

In the digital camera 100 in the focus-priority mode, the controller 135 determines whether any subject is detected in image recognition based on the detection information D1 of the image recognizer 122 (S1A), instead of step S1 in FIG. 6. When there is a detected subject (YES in S1A), the controller 135 determines whether a focus subject is selected by a user operation on the operation member 150 (S1B).

When the focus subject is selected (YES in S1B), the controller 135 sets a type of the selected subject as a target type, and causes the audio processing engine 170 to start sound extraction (S2A), as in step S2 in FIG. 6. At this time, the controller 135 causes the display monitor 130 to display the sound extraction icon 5 so that the target type mark 5a indicates the type of the selected subject (refer to FIG. 8C). Displaying level in the amplification level bar 5b is controlled corresponding to the gain G1 by the controller 135 in the subsequent steps S4 and S8 as in the first embodiment.

After amplification (S3, S4) of the extracted sound by the audio processing engine 170, instead of step S5 in FIG. 6, the controller 135 determines whether a user operation to change the focus subject to be focused is performed on the operation member 150 (S5A).

Figure 11A:
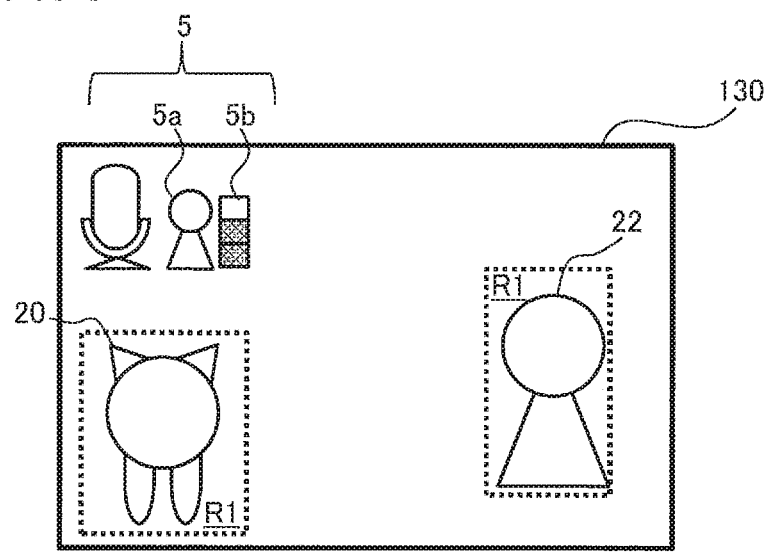
FIGS. 11A and 11B are diagrams illustrating an operation example of the digital camera when a focus subject moves.
Figure 11B:
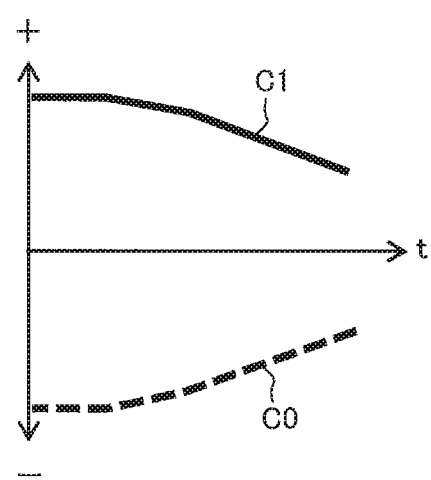

When there is no change in focus subject (NO in S5A), the controller 135 acquires the detection information D1 again from the image recognizer 122, and determines whether the subject selected as the focus subject is detected at the present time (S5B). When the focus subject is detected in image recognition at the present time (YES in S5B), the controller 135 performs the processes from step S6 onward as in the first embodiment. FIGS. 11A and 11B exemplify an operation example when the focus subject moves.

FIG. 11A illustrates a display example subsequent to FIG. 8C. FIG. 11B exemplifies change in sound corresponding to FIG. 11A. In the example of FIG. 11A, the person 21 selected as the focus subject in FIG. 8C moves and no longer appears in the image on the display monitor 130. In the image recognizer 122, the other subjects 20 and 22 are detected, but the person 21 selected as the focus subject is not detected. When the focus subject is no longer detected (NO in S5B) as described above, the controller 135 reduces the gain G1 of the extracted sound (S8) as shown by the curve C1 in FIG. 11B, for example.

Figure 12A:
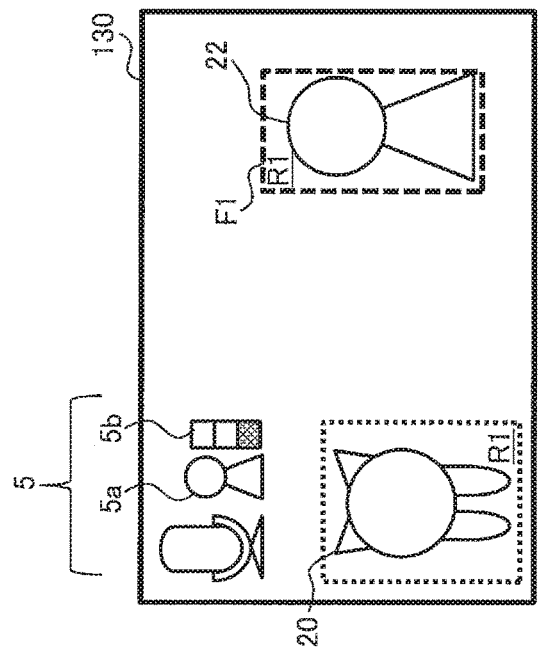
FIGS. 12A to 12D are diagrams illustrating an operation example of the digital camera in response to a user operation for changing the focus subject.
Figure 12B:
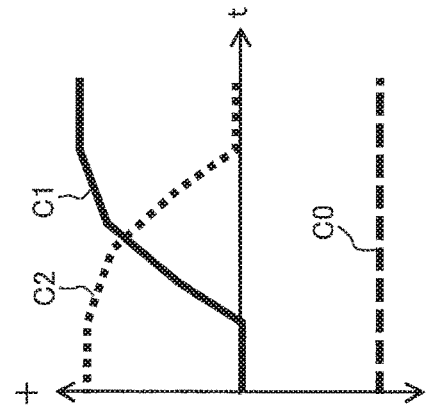

FIGS. 12A to 12D exemplify an operation example in which there is ca user operation to change the focus subject (YES in S5A). FIG. 12A illustrates a display example subsequent to FIG. 11A. FIG. 12B exemplifies change in sound corresponding to FIG. 12A. The graph of FIG. 12B further includes a curve C2 indicating an extracted sound of the type "cat". In step S5A, for example, the controller 135 may proceed to "YES" when the type of the focus subject changes, and may proceed to "NO" when the type of the focus subject does not change before and after the change.

In the example of FIG. 12A, the cat 20 is selected as a new focus subject, and the target type mark 5a of the type "cat" is displayed. When there is a change in the type of focus subject (YES in S5A), the controller 135 determines whether the focus subject after the change is detected in image recognition (S20) as illustrated in FIG. 10, for example. When the focus subject is detected (YES in S20), the controller 135 sets a type of the focus subject as a target type and causes the audio processing engine 170 to start sound extraction (S21), as in step S2A. At this time, for example, the controller 135 updates the target type mark 5a displayed FIG. 11A to indicate a new target type as illustrated in FIG. 12A.

The controller 135 determines whether a sound of the target type after the change is extracted in the sound extraction 174 (S2), as in step S3. In the example of FIG. 12B, when the cat 20 mews, an extracted sound of the type "cat" is obtained and gradually increased. At this time, sound extraction for the focus subject before the change is not stopped immediately.

Hereinafter, the gain of the extracted sound for the target type after the change is denoted as "G1a", and the gain of the extracted sound for the target type before the change is denoted as "G1b". When a voice of the target type after the change is extracted (YES in S22), the gain G1a of the target type after the change is increased (S23), and the gain G1b of the target type before the change is reduced (S24). Further, the gain G0 of the movie sound is appropriately set in accordance with the gains G1a and G1b so that a sound volume before processing is maintained after the processing. The amplification level bar 5b is controlled by the controller 135 so as to indicate the level correspond to the gain G1b after the change, for example.

Until the gain G1b of the target type before the change reaches the minimum value (S25), the controller 135 repeats the processes of steps S22 to S25 (NO in S25). When the gain G1b reaches the minimum value (YES in S25), the controller 135 stops sound extraction for the target type before the change (S26), and causes processing to return to step S5A in FIG. 9, for example.

When the focus subject is not detected in image recognition (NO in S20), the controller 135 causes the processing to proceed to step S8. This enables addressing a case even when a user operation of focusing on a region that is not subjected to image recognition and sound extraction.

Figure 12C:
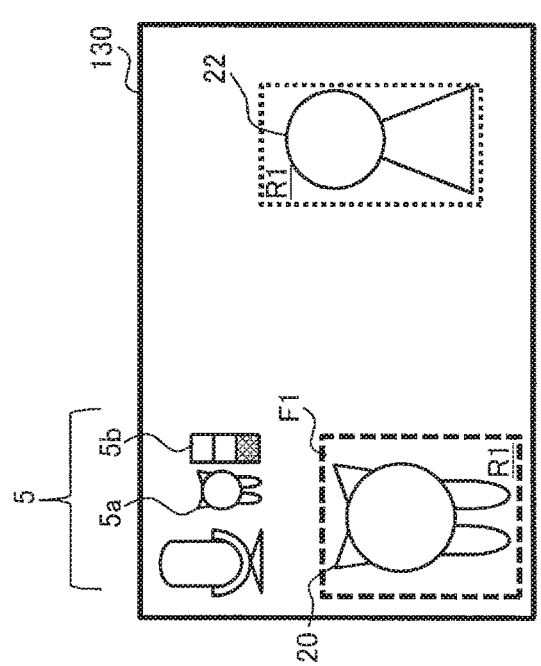
Figure 12D:
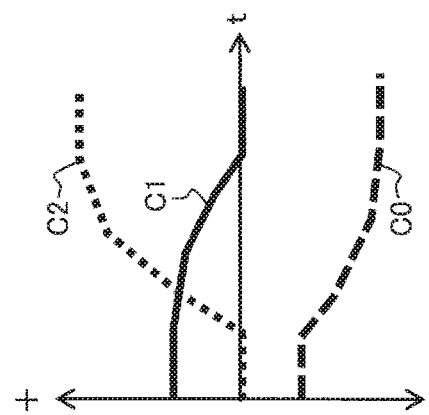

The processes above enable achieving audio processing that emphasizes a voice of a specific subject in conjunction with not only image recognition, but also selection of a focus subject by a user. FIGS. 12C and 12D exemplify further operation example by another user operation to change the focus subject (YES in S5A). FIG. 12C illustrates a display example subsequent to FIG. 12A. FIG. 12D exemplifies change in sound corresponding to FIG. 12C.

In the example of FIG. 12C, the focus subject is switched from the cat 20 to the person 22. As described above, when the cat 20, as the previous target type of the sound extraction is still continuously detected in the image recognition (YES in S5B), switching the focus subject to the person 22 by the user operation (YES in S5A) causes sound extraction of a target type of "person" to be started in conjunction with focusing (S21). Change in sound at this time is also performed gently as illustrated in FIG. 12D to enable obtaining a voice that is comfortable for the user to hear.

In the above steps S1B and S5A, examples of the user operation of selecting a focus subject include a touch operation on the touch panel and a selection operation using various keys, for the detection region R1 for each of the subjects 20 to 22 on the display monitor 130, for example. Besides this, a user operation using a function of the digital camera 100, automatically selecting a default focus subject, may be used.

For example, the controller 135 of the digital came 100 may automatically select a subject that is positioned at the center of the entire image or appears relatively large based on the detection information D1 of the image recognizer 122 as a default focus subject. When a user performs various operations such as changing a direction in which the digital camera 100 is directed and changing a zoom value by using an automatic selection function as described above, a desired subject can be selected by the digital camera 100 as the focus subject. A result of such selection can be checked based on a display state of the indication frame F1 of a focus subject, for example. Even in steps S1B and S5A in this case, the digital camera 100 enables a type of a subject selected as the focus subject to be set as a target type as in the above case. Each section of the digital camera 100 used for the user operation as described above is an example of the operation member in the present embodiment.

2-3. Summary

As described above, the digital camera 100 according to the second embodiment is configured such that the display monitor 130 further displays information indicating a detection result of a subject by the image recognizer 122. The operation member of the digital camera 100 according to the present embodiment is configured to set a target type according to a user operation that specifies a subject to be focused in the digital camera 100 based on information displayed on the display monitor 130. Accordingly, a target type of sound extraction can be set dynamically according to the user operation, and a voice of a type desired by the user can be clearly obtained.

In the present embodiment, the digital camera 100 (imaging apparatus) includes the image sensor 115 (imager), the microphone A/D converter 165 (audio input device), the image recognizer 122 (detector), the display monitor 130 (display), the audio processing engine 170 (audio processor), the operation member 150 (operation member), and the controller 135 (processor). The operation member of the present embodiment may select a subject to be focused in the image from subjects detected by the detector based on an operation on the imaging apparatus performed by a user (S1B). The audio processor may process the audio data received by the audio input device based on the type of subject selected by the operation member (S2A to S10). The controller 135 may cause the display to display the target type mark 5a as an example of target type information indicating a type of a subject to be focused as a target type to be processed by the audio processor (S2A, FIG. 8C, etc.). This enables a user to check a current target type at any time when shooting a moving image or the like, and thus enables easily and clearly obtaining sound such as a voice of the subject according to a user's intention.

In the present embodiment, the controller 135 is configured to further cause the display to display the amplification level bar 5b as an example of emphasis level information indicating a level at which a voice of the subject selected the audio processor is emphasized or suppressed (S4, S8, FIG. 8C, etc.). This enables a user to check the level at which the voice or the like obtained during shooting the moving image or the like is emphasized or suppressed, and thus facilitates acquiring the voice according to a user's intention.

In the present embodiment, in response to change of the focus subject with a type of the focus subject after the change being different from the target type before the change (YES in S5B), the controller 135 may update the target type information to indicate the type after the change as a target type and cause the display to display the updated target type information (S21, FIGS. 12A and 12C, etc.). This enables the user to check the target type that dynamically changes during shooting, and thus enables easily acquiring a voice of the subject according to a user's intention.

Third Embodiment

Hereinafter, a third embodiment will be described with reference to FIGS. 13 and 14. The digital camera 100 according to each of the first and second embodiments extracts sound of a specific type in conjunction with image recognition. In the third embodiment, it will be described that a digital camera further controls directivity of sound collection in conjunction with image recognition.

Hereinafter, the digital camera according to the present embodiment will be described, while description of configuration and operation similar to those of the digital cameras 100 according to the first and second embodiments will be omitted as appropriate.

3-1. Configuration

Figure 13:
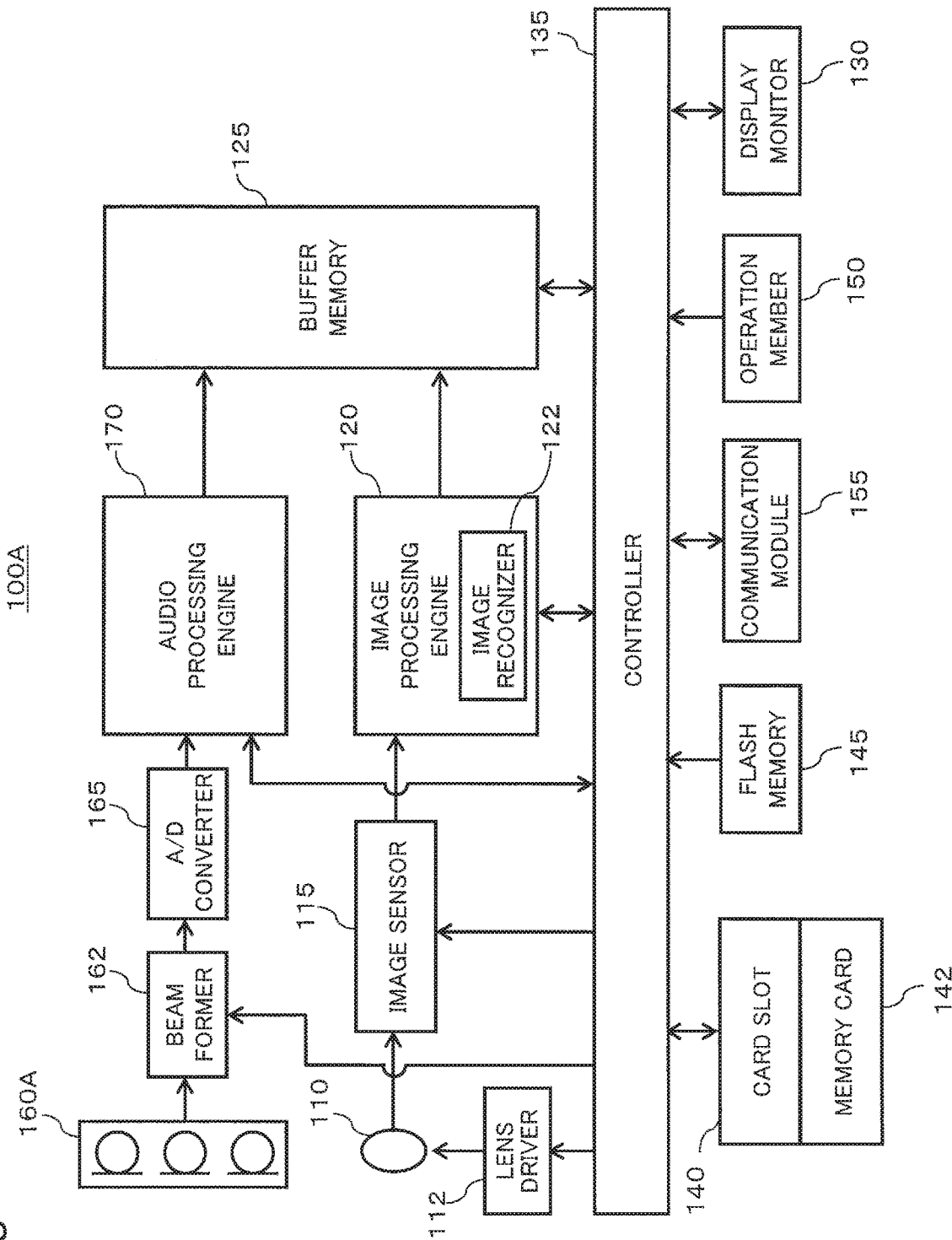
FIG. 13 is a diagram illustrating a configuration of a digital camera according to a third embodiment.

FIG. 13 is a diagram illustrating a configuration of a digital camera 100A according to the third embodiment. The digital camera 100A of the present embodiment has a configuration similar to that of the digital cameras 100 of the first and second embodiments, including a plurality of microphones 160A, and further includes a beam former 162 to generate directivity of collected voice. The microphone 160A of the present embodiment includes three or more microphone elements, for example, and is disposed with the microphone elements positioned from each other.

The beam former 162 is a circuit that adjusts a delay period of each element of the microphone 160A, for example. The beam former 162 forms a beam for sound collected by the microphone 160A in a desired direction and width. The beam former 162 can set a physical range in which the microphone 160A collects voice. The beam former 162 may be configured integrally with the microphone 160A or the A/D converter 165. The function of the beam former 162 may be implemented in the audio processing engine 170.

3-2. Operation

Figure 14:
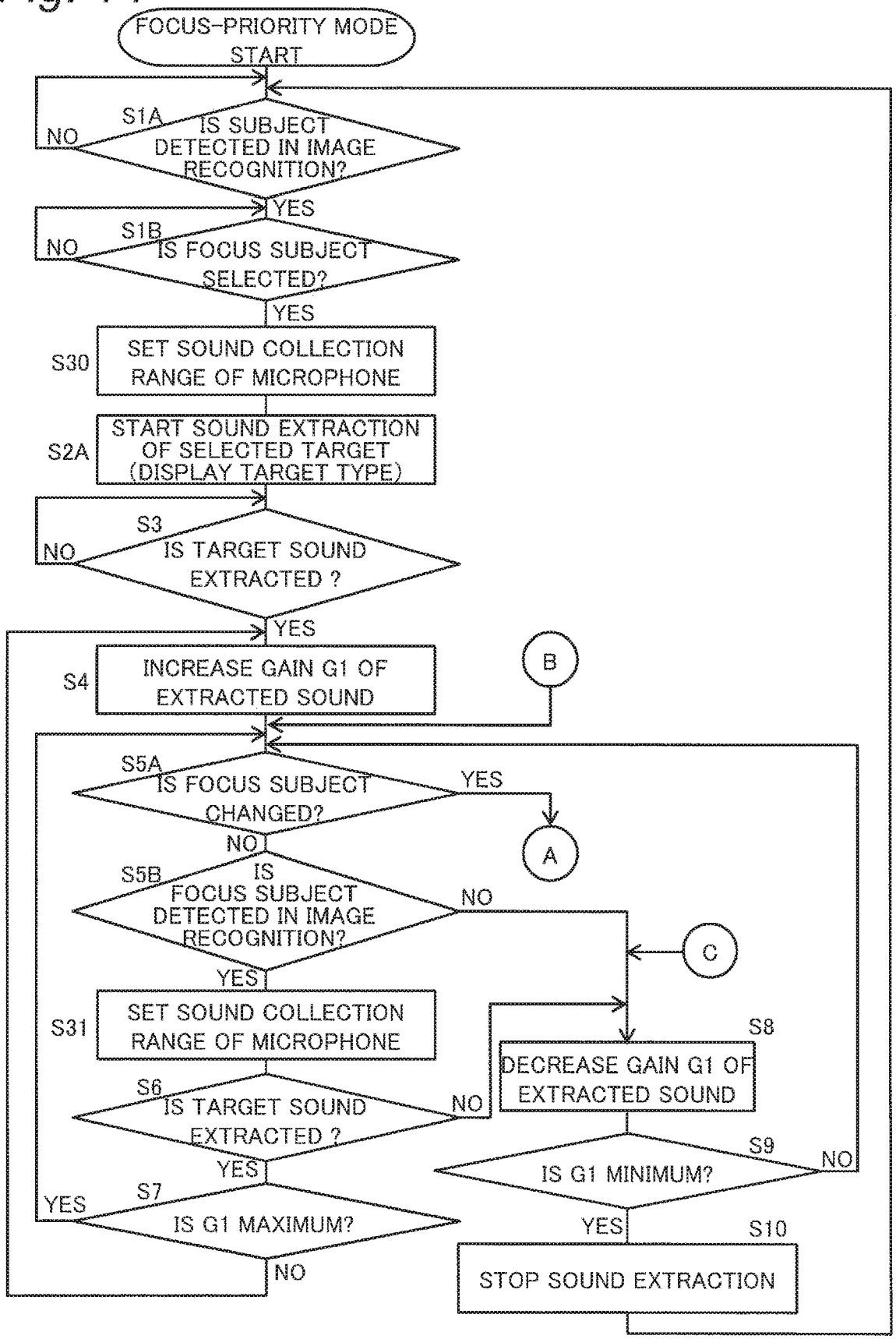
FIG. 14 is a flowchart exemplifying an operation of the digital camera according to the third embodiment.

FIG. 14 is a flowchart exemplifying an operation of the digital camera 100A according to the third embodiment. In the digital camera 100A of the present embodiment, the controller 135 controls the beam former 162 so as to vary a sound collection range of the microphone 160A based on the detection information D1 of the image recognizer 122 (S30, S31), in addition to processing similar to that in the first and second embodiments. FIG. 14 illustrates an operation example in which the sound collection range is dynamically set in the focus-priority mode (FIG. 9).

For example, when a subject to be focused is selected (YES in S1B), the controller 135 controls the beam former 162 such that the microphone 160A collects sound from a direction of the subject based on the detection information D1 of the image recognizer 122 at that time (S30). The beam former 162 forms a beam of the microphone 160A in accordance with a position and a size of the detection region R1 of a specific subject in the detection information D1. Accordingly, the microphone 160A collects sound within the sound collection range corresponding to image recognition, and sound extraction of a target type is applied to audio data within the sound collection range (S2A).

Also when image recognition of a focus subject continues (YES in S5B), the controller 135 sequentially sets the sound collection range of the microphone 160A by controlling the beam former 162 (S31), as in step S30. Accordingly, the sound collection range of the microphone 160A is changed in accordance with movement of the subject to be focused or change to another subject, for example.

According to the above processing, the sound collection range of the microphone 160A is directed to the subject to be focused in accordance with a detection result of the image recognizer 122, and thus a sound from the subject can be obtained more clearly. While in the above description, it is exemplified that the sound collection range of the microphone 160A is controlled by the beam former 162 in the focus-priority mode, the present embodiment is not limited to this. The sound collection range may be controlled in other operation modes such as the person-priority mode.

3-3. Summary

As described above, the digital camera 100A of the third embodiment further includes the beam former 162. The beam former 162 is configured to change the range in which the microphone 160A collects sound in accordance with a detection result of the image recognizer 122. This enables a voice from a subject detected by the image recognizer 122 to be obtained more clearly.

Other Embodiments

As described above, the first to third embodiments are described as examples of the technique disclosed in the present application. However, the technique the present disclosure is not limited to this, and can also be applied to an embodiment in which modification, replacement, addition, elimination, or the like is appropriately performed. A new embodiment can be made by combining some components described in any of the embodiments described above.

In the first and second embodiments, the person-priority mode and the focus-priority mode of the digital camera 100 are described. This kind of operation mode can be set by a user operation on the operation member 150. For example, the digital camera 100 may be configured to display a menu screen on the display monitor 130 to enable the operation modes above to be selected by a user.

While in each of the above embodiments, the type "person" as an example of the first type, and the type "cat" as an example of the second type, are exemplified, the first and second types are not limited to the above, and various types may be used. For example, the second type is not limited to "cat", and may be various animals such as "dog" and "bird", or may be a type "animal" including various animals other than a person. In addition, not only a person or an animal, but also an object having a specific sound such as a train or a musical instrument, may be used as a type appropriately. The sound from such an object can be a subject to be emphasized or suppressed as a background sound, for example. Furthermore, the first type is not limited to an unspecified "person", and may be a specific individual person, for example. In this case, the second type may be an individual person different from the first type.

That is, in the present embodiment, the first and second types each may be set to various types regarding any one of a person, an animal other than a person, and an object having a background sound. In addition, the plurality of types set in the digital camera 100 may further include types other than the first and second types.

Even various types as described above enable achieving operation similar to that in the above embodiments by preparing a data set for training images and voices suitable for respective types in machine learning, for example. In addition, even such various types enable the audio processing engine 170 to emphasize or suppress a voice of a desired type in conjunction with the image recognizer 122 as in each embodiment described above by associating types set in the image recognizer 122 and the audio processing engine 170 with each other. The types set in the image recognizer 122 and the audio processing engine 170 are not necessarily identical. For example, a type set in the image recognizer 122 may be more subdivided than the type set in the audio processing engine 170. The types set in the image recognizer 122 may include types that are not set as target types of audio processing and are not set in the audio processing engine 170.

In each of the above embodiments, the target type mark 5a is exemplified as an example of the target type information, and the amplification level bar 5b is exemplified as an example of the emphasis level information. In the present embodiment, the target type information is not limited to the target type mark 5a, and may be textual information such as a name of a target type or an image such as a thumbnail. The emphasis level information also is not limited to the amplification level bar 5b, and may be textual information such as a number indicating a level of emphasis or suppression, or a graph such as a pie chart. The target type information and the emphasis level information also may be displayed as independent icons.

In each of the above embodiments, the digital camera 100 including the image recognizer 122 is described. In the present embodiment, the image recognizer 122 may be provided in an external server. In this case, the digital camera 100 may transmit image data on a captured image to the external server using the communication module 155, and may receive the detection information D1 on a processing result by the image recognizer 122 from the external server. In the digital camera 100 as described above, the communication module 155 functions as a detector. For example, the functions of the audio processing engine 170 such as the sound extraction unit 174 also may be performed by the external server similarly to the above.

In each of the above embodiments, the digital camera 100 including the optical system 110 and the lens driver 112 is exemplified. The imaging apparatus of the present embodiment may not include the optical system 110 and the lens driver 112, and may be an interchangeable lens type camera, for example.

While in each of the above embodiments, a digital camera is described as an example of the imaging apparatus, the present disclosure not limited to this. The imaging apparatus of the present disclosure may be an electronic device having an image capturing function (e.g., a video camera, a smartphone, a tablet terminal, or the like).

As described above, the embodiments are described as examples of the technique in the present disclosure. For the technique, the accompanying drawings and detailed description are provided.

Thus, the components described in the accompanying drawings and the detailed description may include not only indispensable components for problem-solving, but also dispensable components for problem-solving, to exemplify the above technique. Because of this, it should not be immediately recognized that the dispensable components are indispensable when the dispensable components are described in the accompanying drawings and detailed description.

In addition, the embodiments described above are for exemplifying the technique in the present disclosure, so that various modifications, replacement, addition, elimination, or the like, can be performed in the scope of claims or its equivalent scope.

The present disclosure is applicable to an imaging apparatus that performs imaging while acquiring sound.

The invention claimed is:

1. An imaging apparatus comprising:
   an imager configured to capture a subject image to generate image data;
   an audio input device configured to receive audio data indicating sound during shooting using the imager;
   a detector configured to detect a subject and a type of the subject based on the image data generated by the imager;
   a display configured to display an image indicated by the image data;
   an operation member configured to select a focus subject in the image from subjects detected by the detector based on a user operation on the imaging apparatus during shooting of a moving image;
   an audio processor configured to process the audio data to emphasize or suppress specific sound in the audio data received by the audio input device based on a type of selected subject by the operation member; and
   a processor configured to cause the display to start displaying target type information in response to selection of the focus subject by the operation member based on the user operation, in addition to the subject image, the target type information indicating the type of subject based on which the audio processor is currently processing the audio data to enable the user to visually confirm the type of subject based on which the audio processor is currently processing the audio data in accordance with the selection of the focus subject during the shooting of the moving image.

2. The imaging apparatus according to claim 1, wherein the processor is configured to further cause the display to display emphasis level information indicating a level at which the audio processor emphasizes or suppresses specific sound of the selected subject.

3. The imaging apparatus according to claim 1, wherein the processor is configured to,
   in response to change of the focus subject with a type of the focus subject after the change being different from the target type before the change,
   update the target type information to indicate the type after the change as the target type, and cause the display to display the updated target type information.

4. The imaging apparatus according to claim 1,
   wherein the detector is configured to detect different subjects and different types of subjects within the image data generated by the imager;
   the audio processor is configured to process the audio data to emphasize or suppress specific sound in the audio data received by the audio input device differently based on type of as selected by the user during shooting of the moving image; and
   the operation member is configured to select the focus subject in the image from different subjects detected by the detector based on the user operation on the imaging apparatus during the shooting of the moving image, wherein selection of the focus subject based on the user operation causes the audio processor to process the audio data in accordance with the type of the focus subject detected by the detector;

wherein the operation member is configured to enable the user to change the type of subject based on which the audio processor is currently processing the audio data to a different type of subject during the shooting of the moving image, and the processor is configured to cause the display to display updated target type information indicating the changed type of subject.

5. The imaging apparatus according to claim 1, wherein the target type information indicating the type of subject includes target type information indicating a person, and target type information indicating a type of subject other than a person, respectively displayed depending upon whether the user operation selects a person or subject other than a person as the focus subject in the image.

6. An imaging apparatus comprising:

an imager configured to capture a subject image to generate image data;

an audio input device configured to receive audio data indicating sound during shooting using the imager;

a detector configured to detect different subjects and different types of subjects within the image data generated by the imager;

a display configured to display an image indicated by the image data;

an audio processor configured to process the audio data to emphasize or suppress specific sound in the audio data received by the audio input device differently based on type of as selected by a user during shooting of a moving image;

an operation member configured to select a focus subject in the image from different subjects detected by the detector based on a user operation on the imaging apparatus during the shooting of the moving image, wherein selection of the focus subject based on the user operation causes the audio processor to process the audio data in accordance with the type of the focus subject detected by the detector; and a processor configured to cause the display to display target type information, in addition to the subject image, indicating the type of subject based on which the audio processor is currently processing the audio data to enable the user to visually confirm the type of subject based on which the audio processor is currently processing the audio data during the shooting of the moving image, wherein the operation member is configured to enable the user to change the type of subject based on which the audio processor is currently processing the audio data to a different type of subject during the shooting of the moving image, and the processor is configured to cause the display to display updated target type information indicating the changed type of subject.

\* \* \* \* \*